United States Patent [19]

Startup et al.

[11] Patent Number: 5,268,845

[45] Date of Patent: Dec. 7, 1993

[54] METHOD FOR DETECTING LOW BATTERY STATE WITHOUT PRECISE CALIBRATION

[75] Inventors: Warren W. Startup; Gregory N. Stewart, both of Austin, Tex.

[73] Assignee: Dell Corporate Services Corp., Austin, Tex.

[21] Appl. No.: 656,262

[22] Filed: Feb. 14, 1991

[51] Int. Cl.⁵ .............................. G05F 1/565
[52] U.S. Cl. ................... 364/483; 323/275; 340/636; 364/550
[58] Field of Search ............. 323/275; 324/158 R; 340/636; 364/483, 550

[56] References Cited

U.S. PATENT DOCUMENTS

| | | | |
|---|---|---|---|
| 3,899,732 | 8/1975 | Staby | 340/636 X |
| 4,288,739 | 9/1981 | Nercessian | 323/275 |
| 5,087,870 | 2/1992 | Salesky et al. | 323/275 X |

Primary Examiner—Edward R. Cosimano

[57] ABSTRACT

A portable electronic system, which can accurately predict impending battery failure, without using expensive comparators, by using voltage and current measurements to determine the source impedance of a battery. Preferably two banks of batteries are used, with a load-switching relay; the voltage and current of both banks is monitored, so that voltage drop under load can be monitored. Alternatively, the voltage variation of a single battery bank can simply be correlated to the current drawn by a changing load.

17 Claims, 37 Drawing Sheets

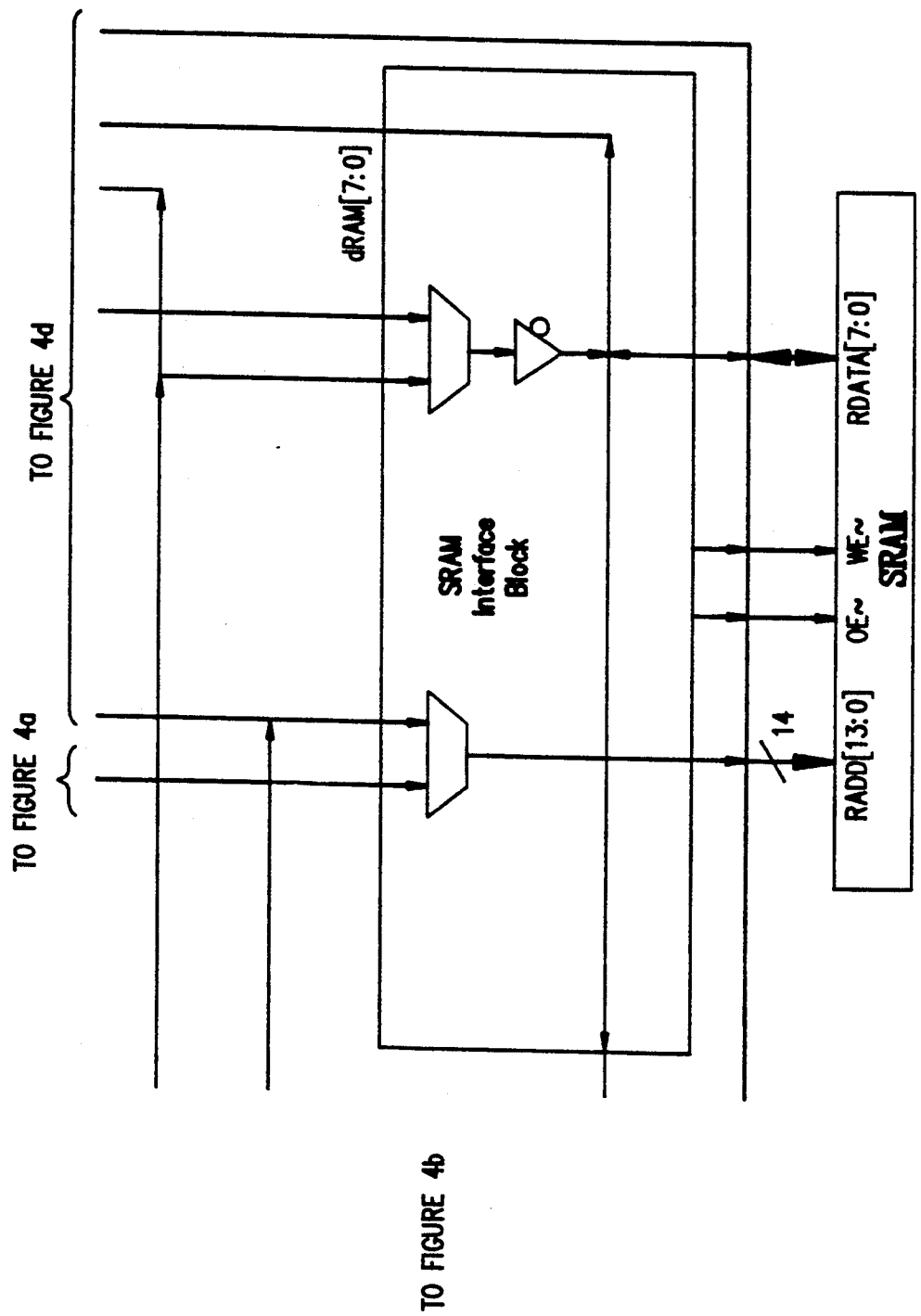

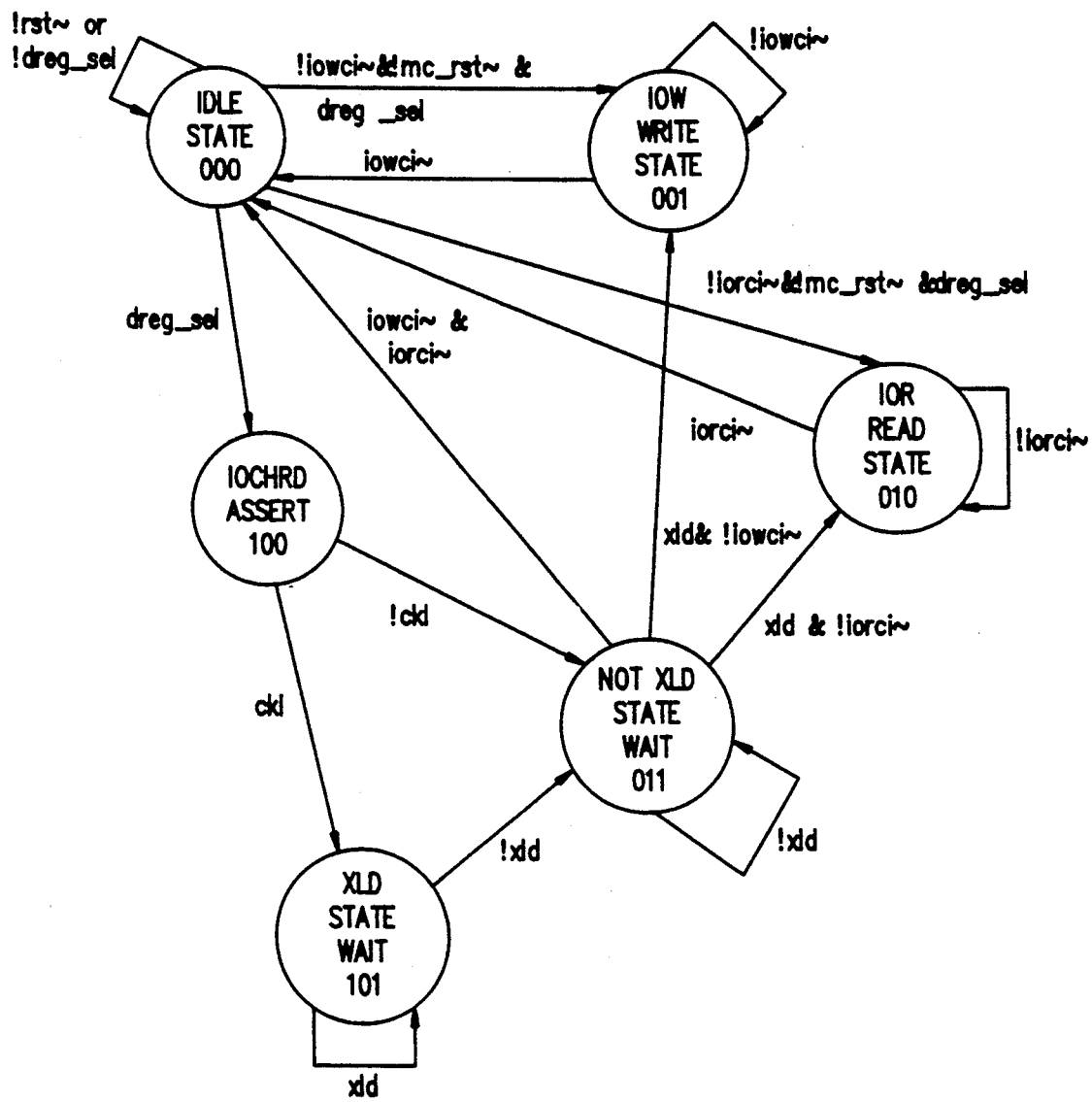
MILES Slave Cycle State Machine, (AT is Master)

MILES MICRO_CONTROLLER SERIAL INTERFACE.

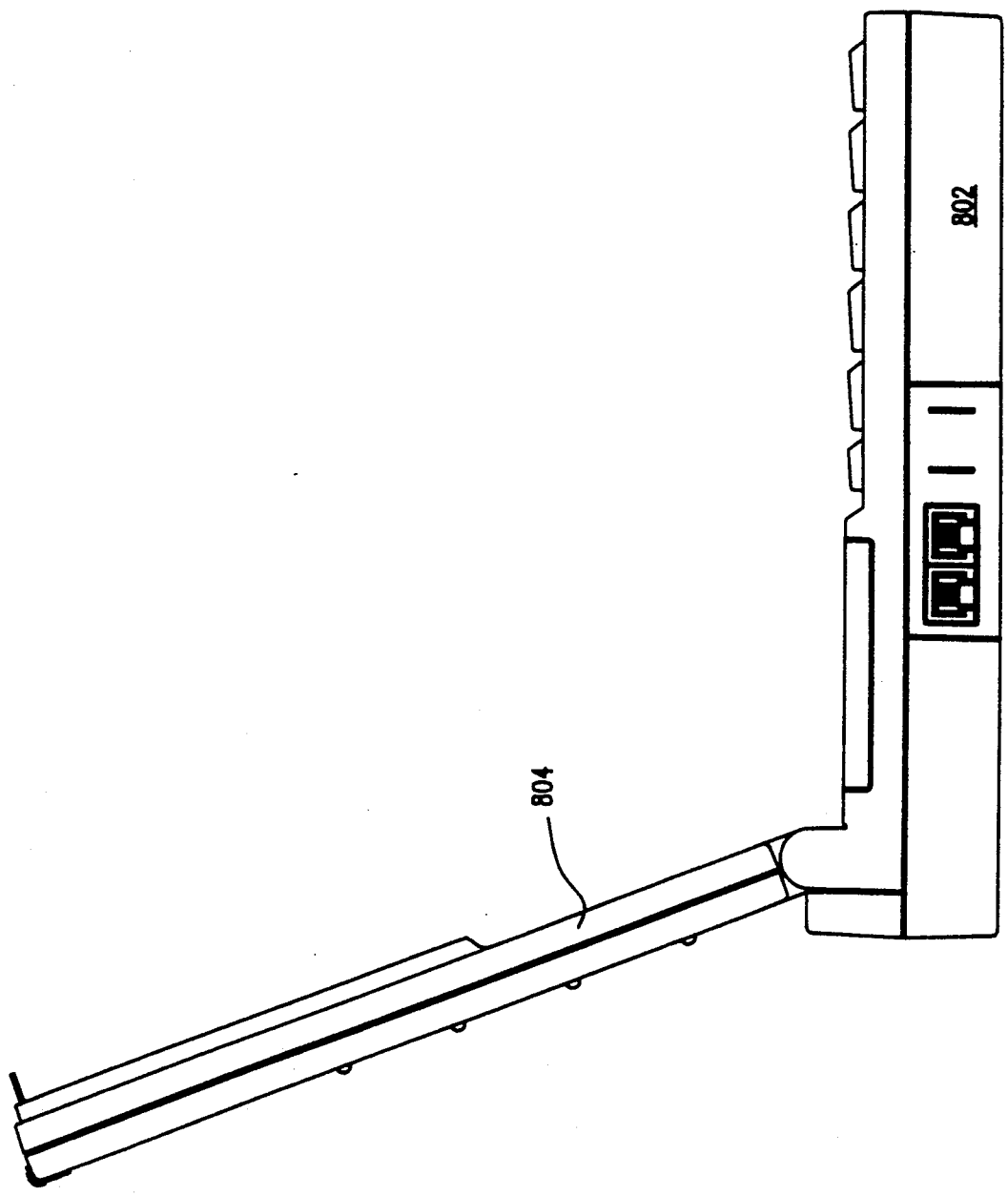

METHOD FOR DETECTING LOW BATTERY STATE WITHOUT PRECISE CALIBRATION

CROSS-REFERENCE TO OTHER APPLICATIONS

The following applications of common assignee contain at least some drawings in common with the present application, and are believed to have effective filing dates identical with that of the present application, and are all hereby incorporated by reference:

Ser. No. 655,889, filed Feb. 14, 1991, entitled "Portable Computer with BIOS-Independent Power Management";

Ser. No. 656,265, filed Feb. 14, 1991, entitled "Rechargeable System with Separate Battery Circuits in a Common Module";

Ser. No. 656,647, filed Feb. 14, 1991, entitled "Portable Computer System with Adaptive Power-Control Parameters";

Ser. No. 655,619, filed Feb. 14, 1991, entitled "Portable Computer with Dual-Purpose Standby Switch" all of which are hereby incorporated by reference.

BACKGROUND AND SUMMARY OF THE INVENTION - DC-00180

The present invention relates to portable battery-powered electronic systems, and particularly to portable battery-powered computers.

Constraints of Available Rechargeable Battery Technology

Portable computers, like many other portable electronic or electrical systems, often use rechargeable batteries for their power source. Users often prefer rechargeable batteries for convenience and for long system life.

The specific rechargeable battery type most often used is the Ni-Cd battery. As of 1990, no other rechargeable battery technology can match the power-to-weight ratio and cost-per-joule of Ni-Cd batteries. Even if affordable new battery technologies are introduced (as may be expected), such improvements will be driven by battery manufacturers, not by computer system designers. Moreover, many of the same battery-management requirements will apply to other battery technologies as well as to Ni-Cd batteries.

Ni-Cd batteries have some significant nonlinearities which make optimal control difficult. Other battery types may share some or all of the following characteristics; but the following discussion will be primarily directed toward Ni-Cd batteries, because of their dominance of the rechargeable battery market.

One non-linear effect is the well-known "memory" effect. If a Ni-Cd battery is repeatedly only partially discharged before recharging, the microstructure of the battery will gradually adapt, so that the battery's full capacity is no longer available.

Another non-linear effect is that total amount of energy which can be withdrawn in a discharge cycle is somewhat dependent on the rate of discharge.

A further non-linear effect is the use of "trickle charge" currents. A battery which is already fully charged can be maintained at maximum readiness by applying a very small current to the battery. This phenomenon is very well known in lead acid batteries and also applies to Ni-Cd batteries.

Prediction of Battery Death

In particular, it is quite difficult to predict exactly when a Ni-Cd battery is at the absolute end of its available charge. However, accurate prediction of this is very important to users.

A significant difficulty in battery-powered electronics is predicting when the battery is about to be exhausted, so that the user may be warned far enough in advance to finish whatever operation he is performing. In many system types (notably in laptop computers), users will wish to continue computing until the last possible minute of battery life. Thus, users dislike excessively cautious power-failure warnings. However, failure to give a power-failure warning will prevent the computer from using orderly shutdown procedures, which can result in a disastrous loss of work.

The best conventional low battery warning systems, in portable equipment, use precisely adjusted voltage comparators that must be individually calibrated by the factory. These give very unreliable results when faced with a varying load condition. If the thresholds are set conservatively, the user may get the failure warning too far in advance, if the load is heavy and then lessens. If the thresholds are set less conservatively, then the user may get no warning at all, if the load suddenly increases (as would occur when a disk drive turns on). In either case, to achieve reasonably repeatable results usually requires manual calibration at time of manufacture, and again when the unit is serviced.

The terminal voltage of the batteries varies considerably with the load, temperature, and type of battery. This is further complicated by the fact that the actual operating voltage of batteries can vary between different manufacturers, and even vary between lots from the same manufacturer. In the case of rechargeable batteries this variation can be greater than the difference in voltage between a battery with half its life left and a battery with only a few minutes of life remaining. Thus, absolute voltage-sensing has inherent limitations. It would be desirable to develop a method of determining the remaining capacity of the battery without depending on its absolute voltage since the voltage has been shown to be a very unreliable indicator of state of charge.

On-the-Fly Measurement of Battery Impedance

The disclosed innovations teach a different approach to battery monitoring. Although the voltage of a battery may remain relatively constant due to the nature of the internal chemical reaction involved, the battery's impedance, as measured by its voltage response to changes in load condition, varies over the life of the battery. This impedance increases near the end of the battery's useful life and can be measured as a voltage delta in response to a change in load current.

The disclosed innovations provide a portable electronic system, which can accurately predict impending battery failure, without using expensive comparators, by using voltage and current measurements to determine the source impedance of a battery. Preferably two banks of batteries are used, with a load-switching relay; the voltage and current of both banks is monitored, so that voltage drop under load can be monitored. Alternatively, the voltage variation of a single battery bank can simply be correlated to the current drawn by a changing load. Voltage drop under load is a more precise indicator of imminent failure than absolute voltage measurement.

The method for detecting low battery charge state without precise calibration, in the presently preferred embodiment, includes the operations of: measuring the battery voltage; measuring the load on the battery; and changing the load on the battery, so that the resulting change in battery voltage can be observed. (In some systems, this may be accomplished simply by normal load variation.)

The low battery detection circuitry continually monitors the changes in battery voltage in response to load changes, and when the change exceeds a threshold indicating that the battery impedance has risen to near its final value a warning is given to the user. This change in internal impedance is much more easily detected then a change in absolute voltage in any situation involving widely varying loads. This method also does not require the voltage measuring circuitry to be calibrated as precisely as normal end point detection methods.

This method is most advantageous in portable computers, but—alternatively and less preferably—can be used in any situation where the load on the battery is not constant. Such as (but not limited to) portable computers; portable medical monitoring equipment; portable medical dosing equipment; portable telecommunications equipment; and other types of motorized equipment, remote measuring devices, etc.

In the presently preferred embodiment, this invention is realized by means of a power-management microcontroller which can take control of the bus in an ISA-architecture personal computer. However, the disclosed method can also be implemented using other hardware or software or hybrid configurations.

BRIEF DESCRIPTION OF THE DRAWING

The present invention will be described with reference to the accompanying drawings, which show important sample embodiments of the invention and which are incorporated in the specification hereof by reference, wherein:

FIGS. 4a, 4b, 4c and 4d are a block diagram of the microcontroller interface chip, in the presently preferred embodiment.

FIG. 5A is a state diagram which shows the operation of a first state machine, in operations where the microcontroller interface chip is accessing the system bus as slave.

FIG. 6A is a diagram of the MC_TOP block shown in FIG. 6a, and FIG. 6A-1 is a diagram of the MC_intfc block shown in FIG. 6A.

FIGS. 6Ba and 6Bb are a diagram of the at_interface block shown in FIG. 6b, and FIG. 6B-1 is a diagram of the index block shown in FIG. 6Ba.

FIG. 6C is a diagram of the sram_intfc block shown in FIG. 6d.

FIG. 6D is a diagram of the misc_blk block shown in FIG. 6e.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overall Organization

The presently preferred embodiment provides a 80C286 or 386SX laptop computer, with hard disk and LCD display, powered by rechargeable Ni-Cd batteries and a nonrechargeable lithium battery.

Physical Conformation

FIGS. 8A-8J show various views of the external physical appearance of the portable laptop computer the presently preferred embodiment. This provides a "laptop" computer, which can provide the full power of a normal personal computer for several hours of operation between battery recharges. This is a "notebook" size laptop computer, measuring approximately 8.5×11×2 inches, in the presently preferred embodiment. Weight, cost and power consumption are important considerations in such products.

Figure 8A:
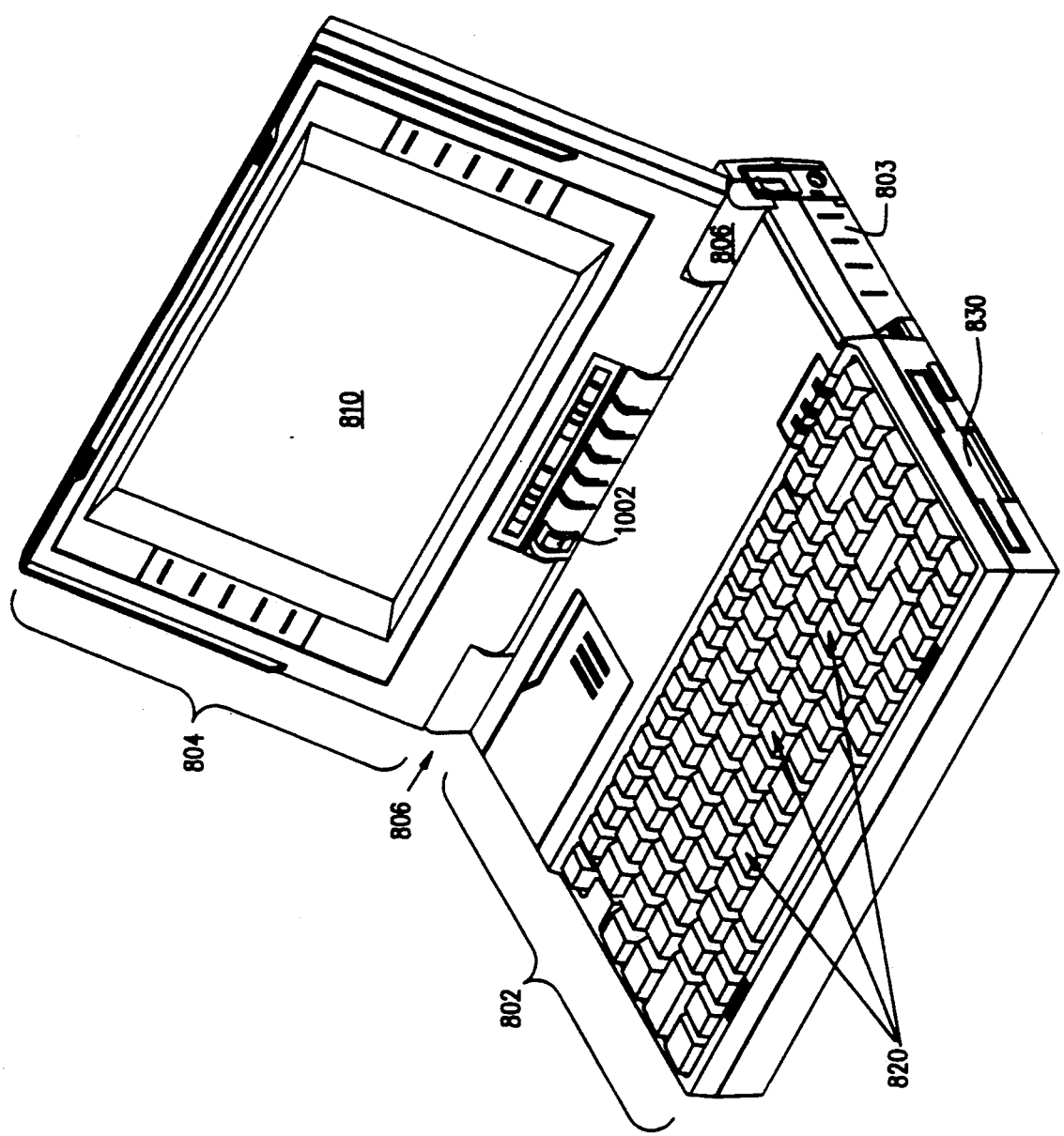
FIGS. 8A-AJ show various views of the external physical appearance of the portable laptop computer of the presently preferred embodiment.

FIG. 8A shows a perspective view of the notebook computer of the presently preferred embodiment in the open position. Visible elements include case 802, cover 804, hinges 806, display screen 810, keyboard 820, floppy disk drive 830, and dust cover 803 (which covers the receptacle for the rechargeable battery pack).

Figure 8B:
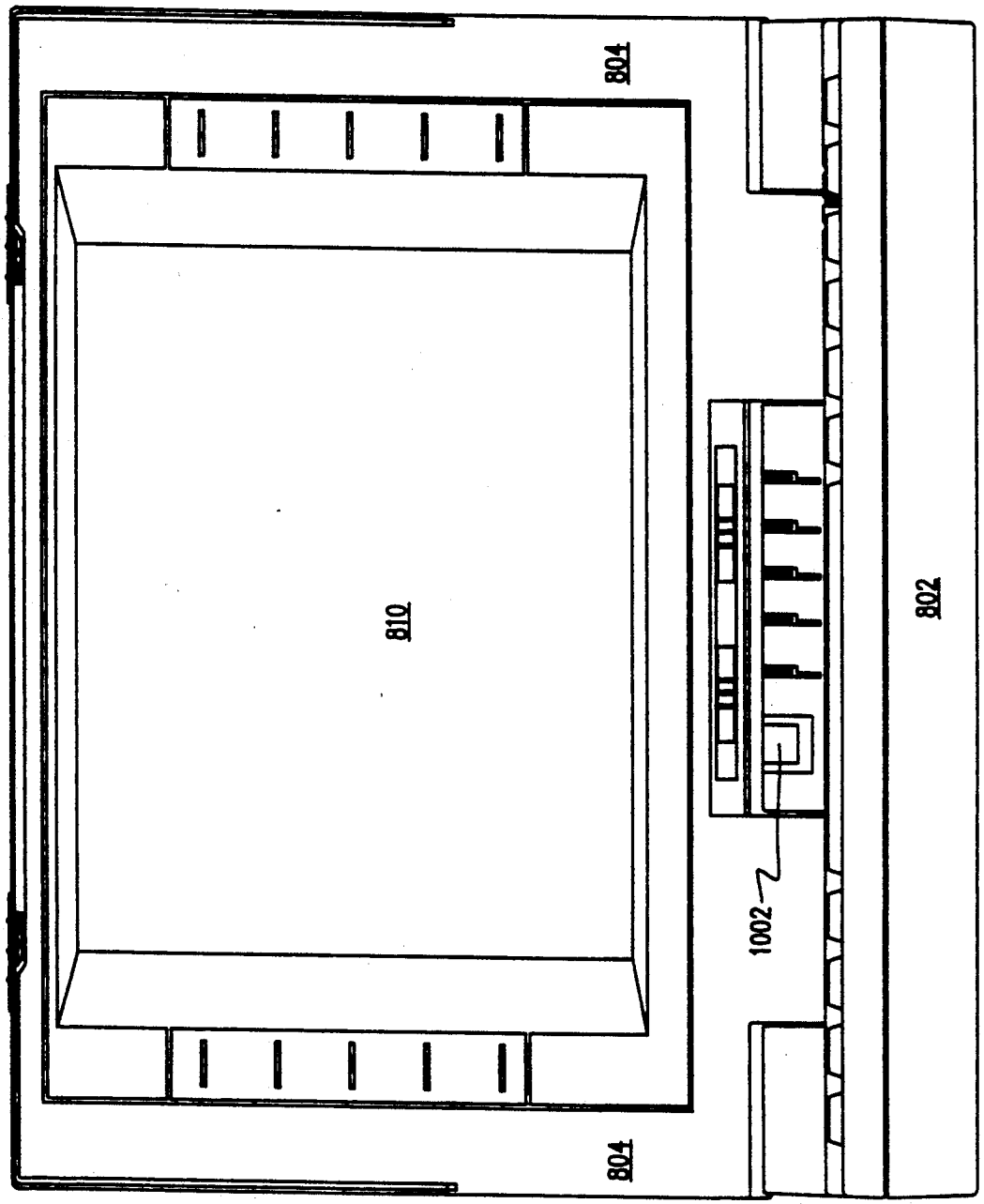

FIG. 8B shows a front view of the computer of FIG. 8A, with the cover open. Note that the dual-purpose standby/sleep button, described below, is visible.

Figure 8C:
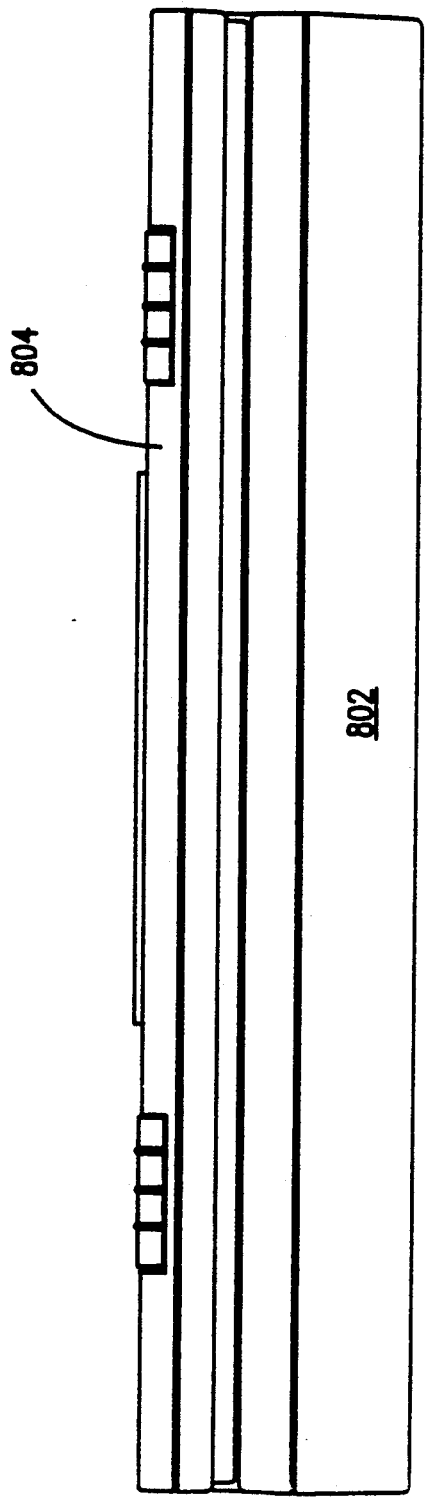

FIG. 8C shows a front view of the computer of FIG. 8A, with the cover closed.

Figure 8D:
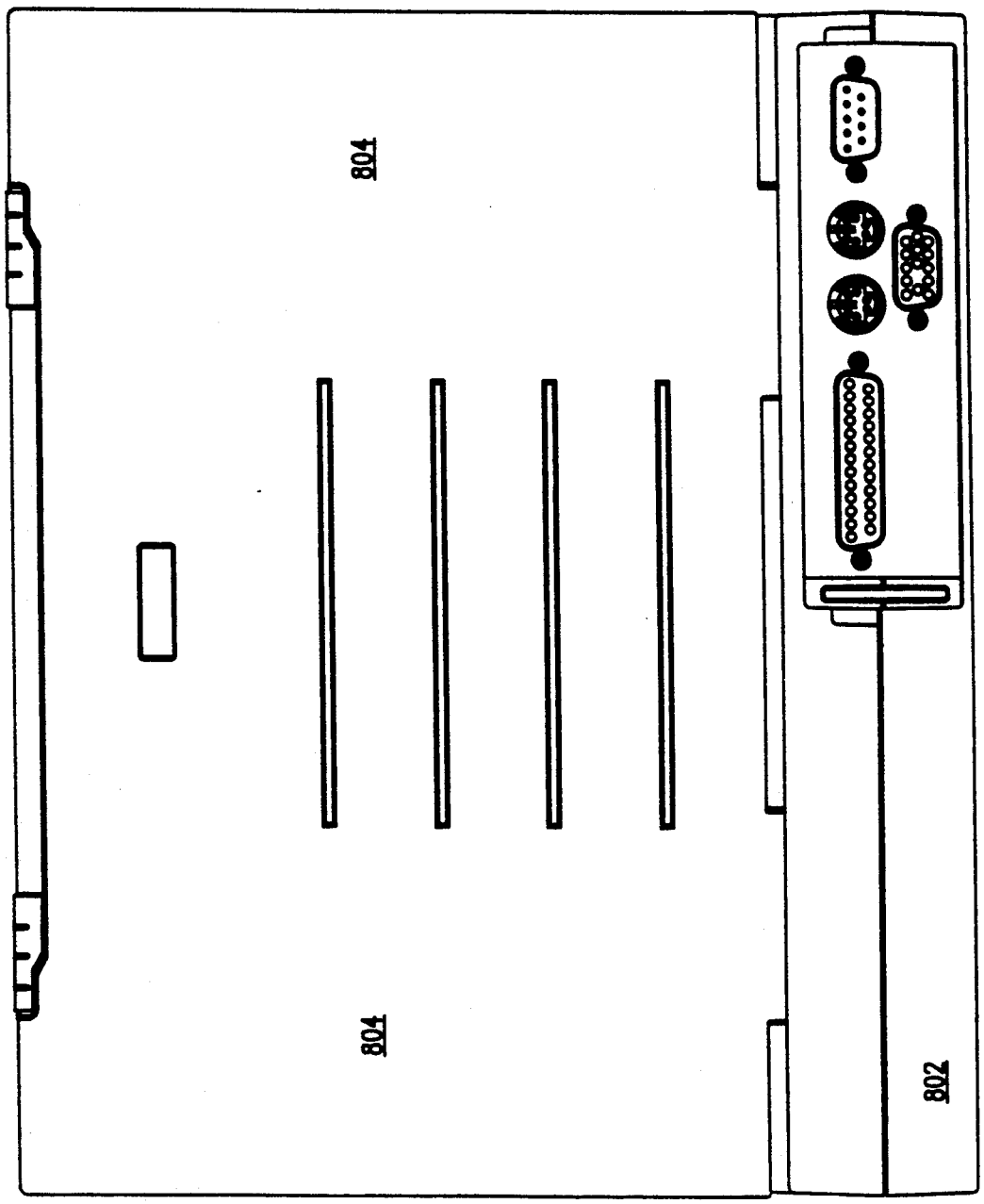

FIG. 8D shows a rear view of the computer of FIG. 8A, with the cover open. Note that keyboard, display, and serial port connectors are visible.

Figure 8E:
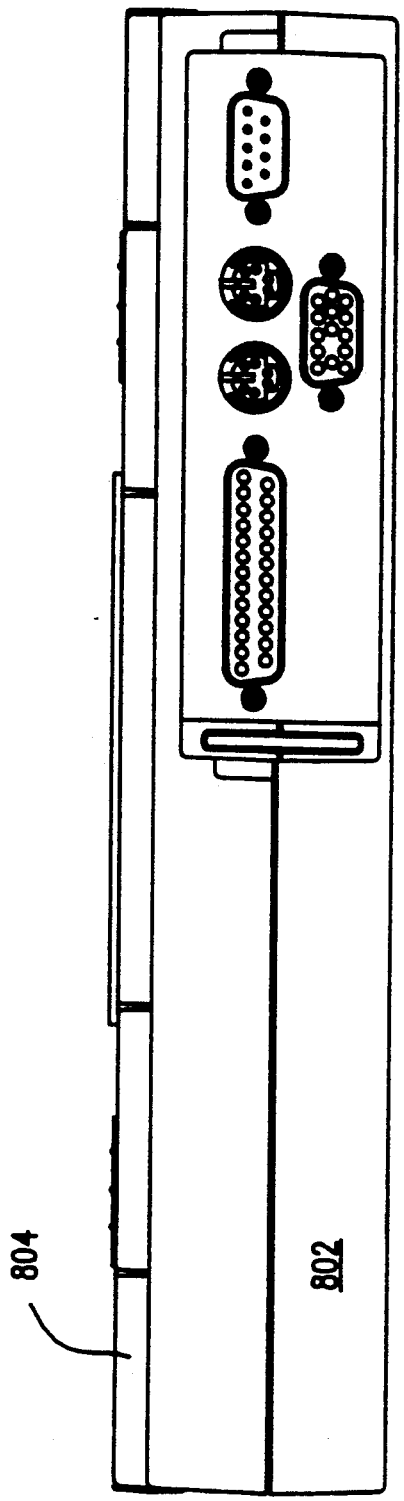

FIG. 8E shows a rear view of the computer of FIG. 8A, with the cover closed.

Figure 8F:
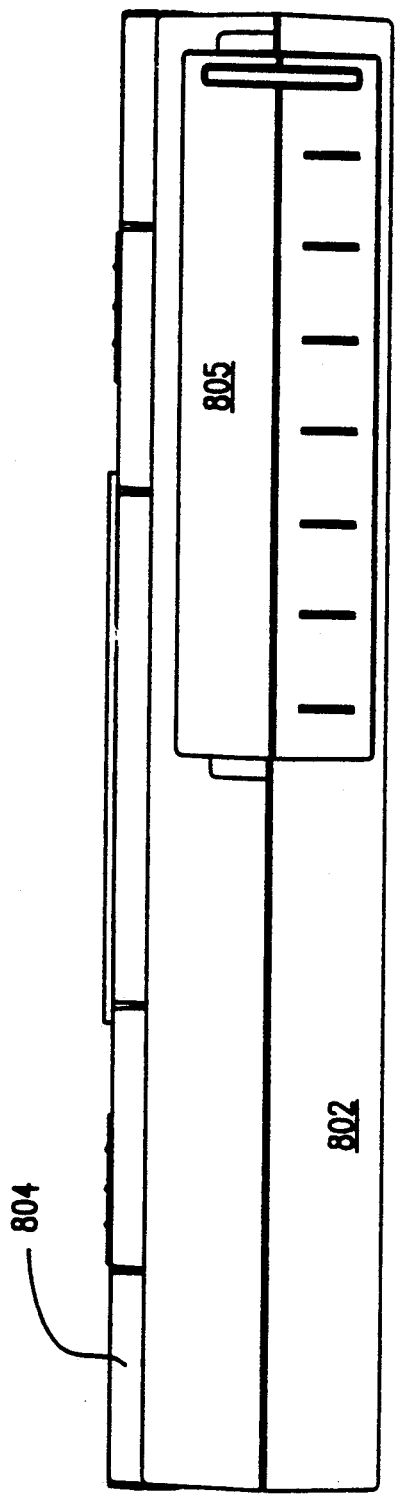

FIG. 8F shows a rear view of the computer of FIG. 8A, with the cover closed, and with a dust cover 805 emplaced to cover the external connectors visible in FIGS. 8D and 8E.

Figure 8G:
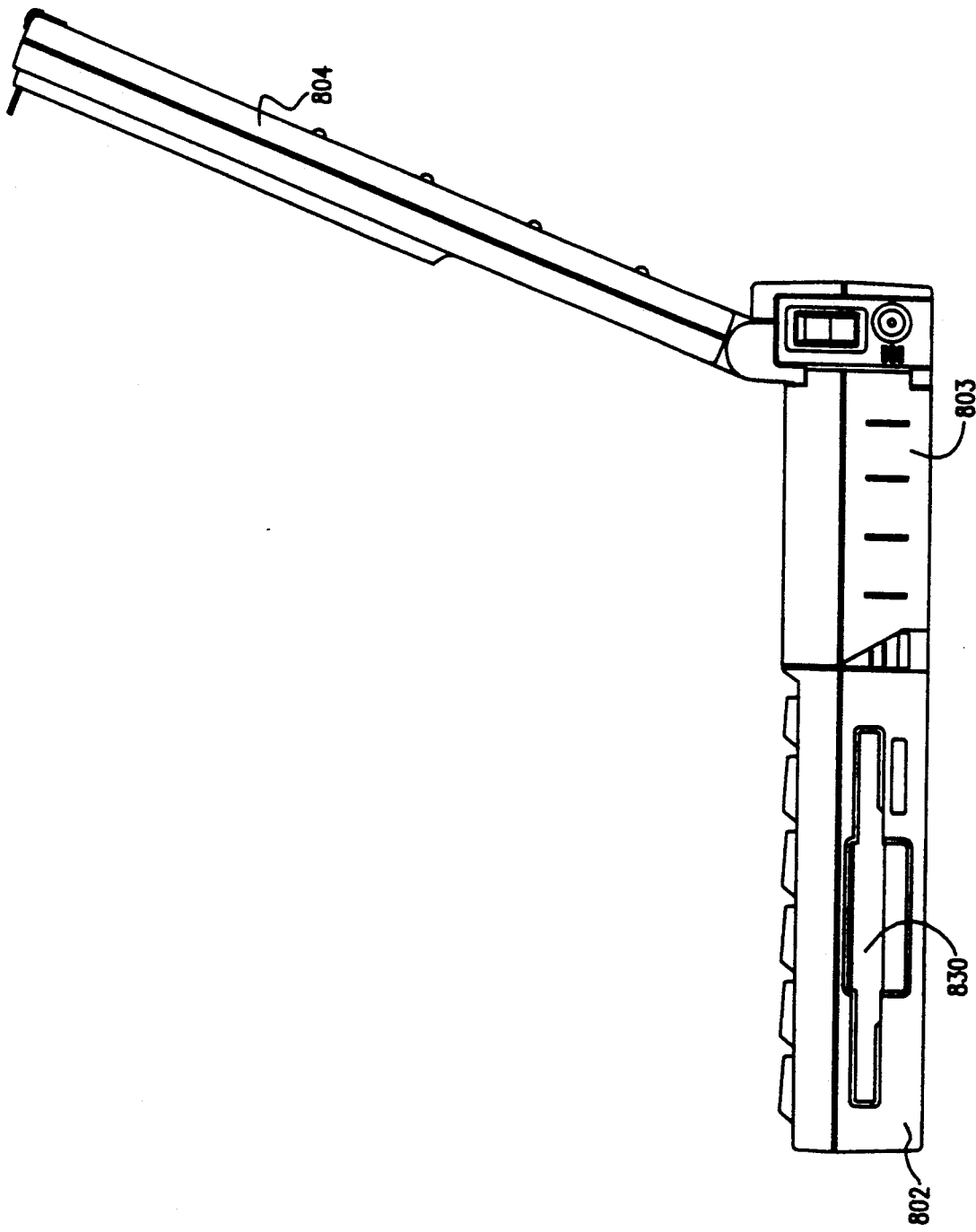
Figure 8H:
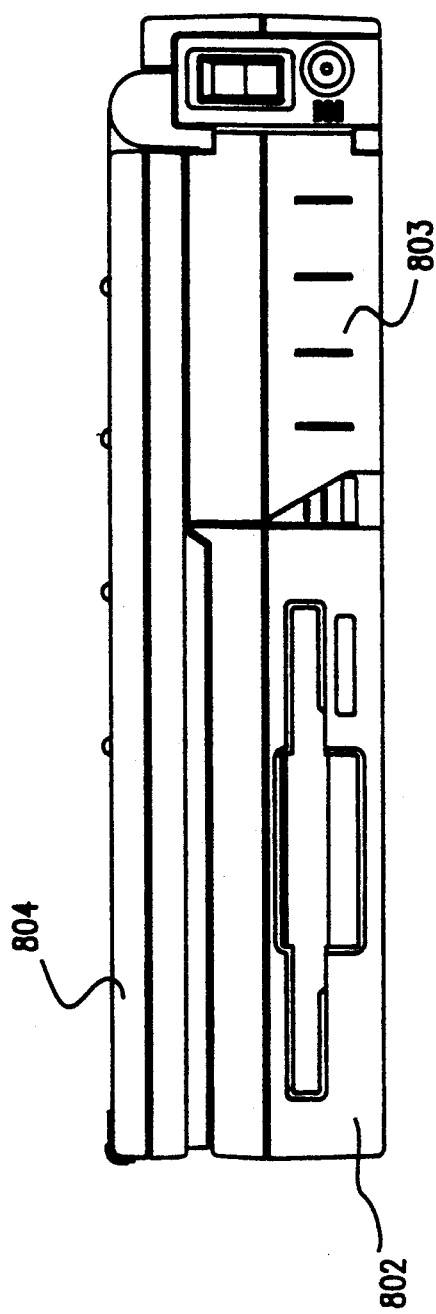
Figure 8J:
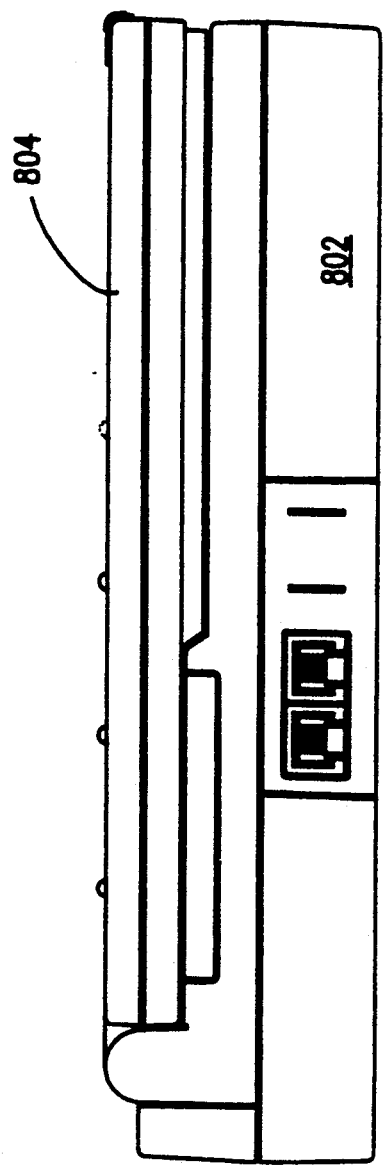

FIG. 8G shows the right side of the computer of FIG. 8A, with the cover open, and FIG. 8H shows the right side of the computer of FIG. 8A, with the cover closed. FIG. 8I shows the left side of the computer of FIG. 8A, with the cover open, and FIG. 8J shows the left side of the computer of FIG. 8A, with the cover closed.

Electrical Organization

Figure 1:
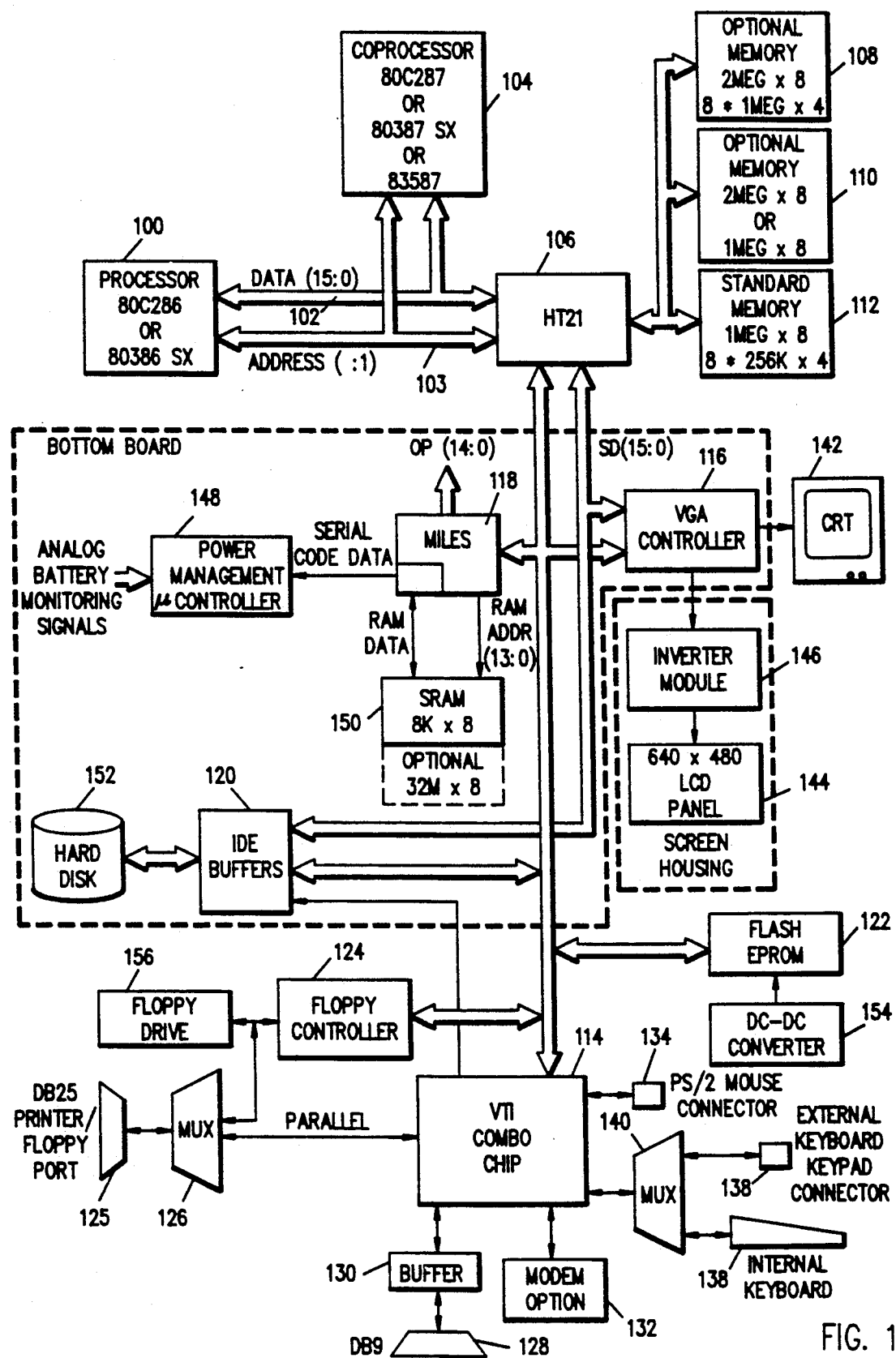
FIG. 1 shows the overall electrical organization of the portable laptop computer of the presently preferred embodiment.

FIG. 1 shows the overall electrical organization of the portable laptop computer of the presently preferred embodiment.

FIG. 1 shows a microprocessor or CPU 100 which communicates via data bus 102 and address bus 103, to a coprocessor 104 and a peripheral support function unit 106. Unit 106 is coupled to memory 108, 110, 112 and to a serial port management and keyboard interface chip 114. Unit 106 and chip 114 are, via several buses, coupled to a VGA controller 116, microcontroller interface chip 118, IDE buffers 120, flash EPROM 122 and floppy disk controller 124. The microcontroller interface chip 114 further is coupled to a DB25 parallel port 125 (via multiplexer 126), a serial port 128 (via buffer 130), a modem 132, a mouse port 134 and an internal keyboard 136 and external keyboard port 138 (both via a multiplexer 140). VGA controller 116 is coupled to an optional cathode ray tube 142 and a liquid crystal display panel 114 via an inverter module 146. Microcontroller interface chip 118 is coupled to a power management microcontroller 148 and static random access memory 150. IDE buffers 120 are coupled to a hard disk drive 152 and to the serial port management and keyboard interface chip 114. Flash EPROM 122 receives power from a DC-DC converter 154. Finally, floppy controller 124 is coupled to floppy drive 156.

The presently preferred embodiment is actually planned for production in two-versions, one using a CMOS version of the 80286 processor and one using a CMOS version of a 386SX processor. Of course, these two processors are extremely similar to each other, and the differences between them have little relevance to the power of management architecture features described. Disclosed innovations can be applied not only to other Intel 8086-derived processors, such as the 80386 and 80486, but can also be applied to other processor families which may, in the future, find use in low-power portable computer systems.

The presently preferred embodiment relates to systems used in the ISA architecture. (Such systems are also referred to as systems which use the "AT bus.") However, it is alternatively possible to adapt at least some of the disclosed teachings to other architectures, such as EISA bus systems or to other buses which may find use in the future.

In the presently preferred embodiment, an HT21 chip, from Headland Technologies, is used to provide a variety of peripheral support functions to the main microprocessor. These include bus management, memory management, interrupt control, and DMA control. Serial port management and keyboard interface are provided by an 82C106 combination chip from VTI. Of course, other implementations of support logic and glue logic can be used if desired, within this well-known architecture.

The presently preferred system embodiment is a family of two highly similar notebook computers, varying primarily in the processors used. Both have an external closed size of about 8.5×11×2 inches. One version is based on an Intel 80C286 microprocessor running at 12.5 MHz, and the other version is based on an Intel 386SX processor running at 20 MHz. Both notebooks contain similar I/O devices, including, in the presently preferred embodiment:

a Sharp VGA flat panel display;
Conners Peripherals 222 or 242 20 or 40 MB 2.5" hard disk;
Epson 3.5" floppy disk drive;
WD 90C20 VGA controller chip;
VTI 82C106 I/O combo chip;
1 MB on board VSOP memory;
2 expansion memory slots; and
Power management microcontroller, with the Microcontroller Interface chip ("MILES") gate array assembly.

In addition, the following I/O connectors are available on the back panel for external devices:
25 pin D connector for parallel/floppy disk;
9 pin D connector for serial;
15 pin D connector for external CRT;
6 pin DIN connector for mouse; and
6 pin DIN connector for external keyboard.

Also available, through slide off panels, are an expansion connector for an optional modem, an 80387SX numeric coprocessor socket, and the 2 expansion memory connectors.

Figure 9:
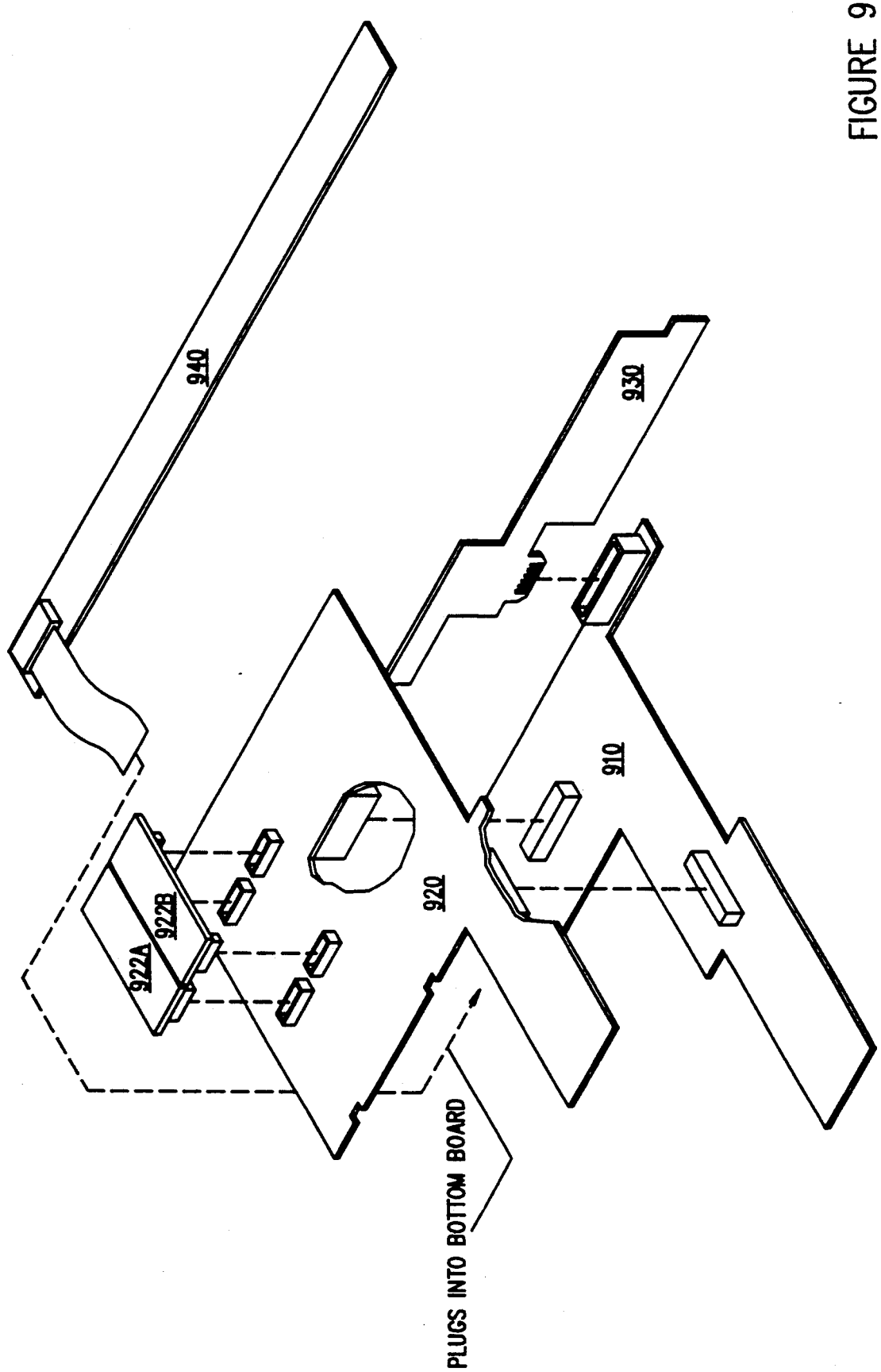
FIG. 9 shows generally how circuit boards are emplaced and connected in the portable laptop computer of the presently preferred embodiment.

FIG. 9 shows generally how circuit boards are emplaced and connected in the portable laptop computer of the presently preferred embodiment. Top board 920, and power module 930, are docked into Bottom board 910. Memory modules 922A and 922B are inserted into the top board 920. An inverter board 940 is connected via cable to the bottom board 910.

Figure 10:
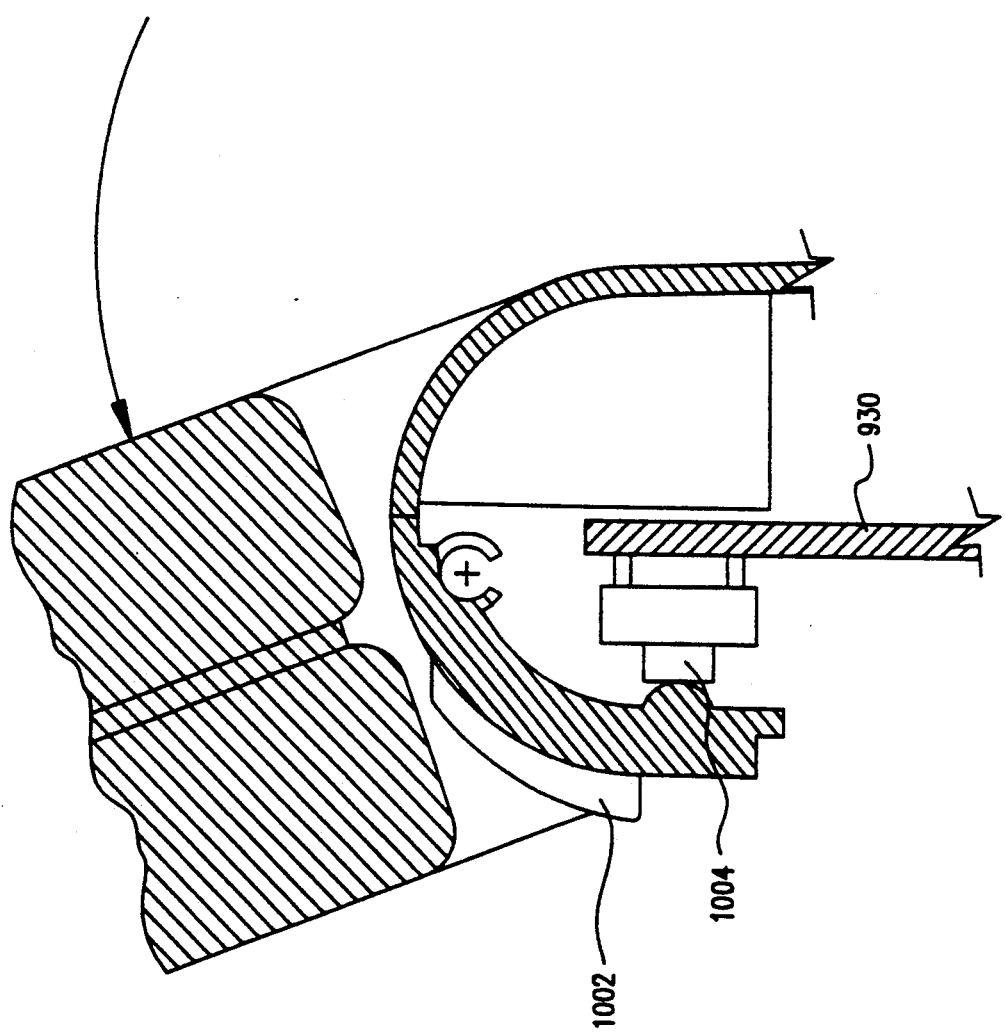
FIG. 10 is a detail view of the case-closing switch and button of the presently preferred embodiment.

FIG. 10 is a detail view of the case-closing switch and button of the presently preferred embodiment. (This is a cutaway view, looking from the right side of the case, showing the lid in the process of closing.) When the lid 804 is closed, it bears against movable lever 1002, which in turn bears against switch 1004. However, when the lid is open, button 1002 is easily accessible to the user's finger, as may be seen in FIG. 8A.

Thus, the cam-like action of lever 1002 provides reliable button depression when the case is closed. The switch 1004 is mounted, in the presently preferred embodiment, on the power module board 930.

Rechargeable Battery Module

Figure 7A:
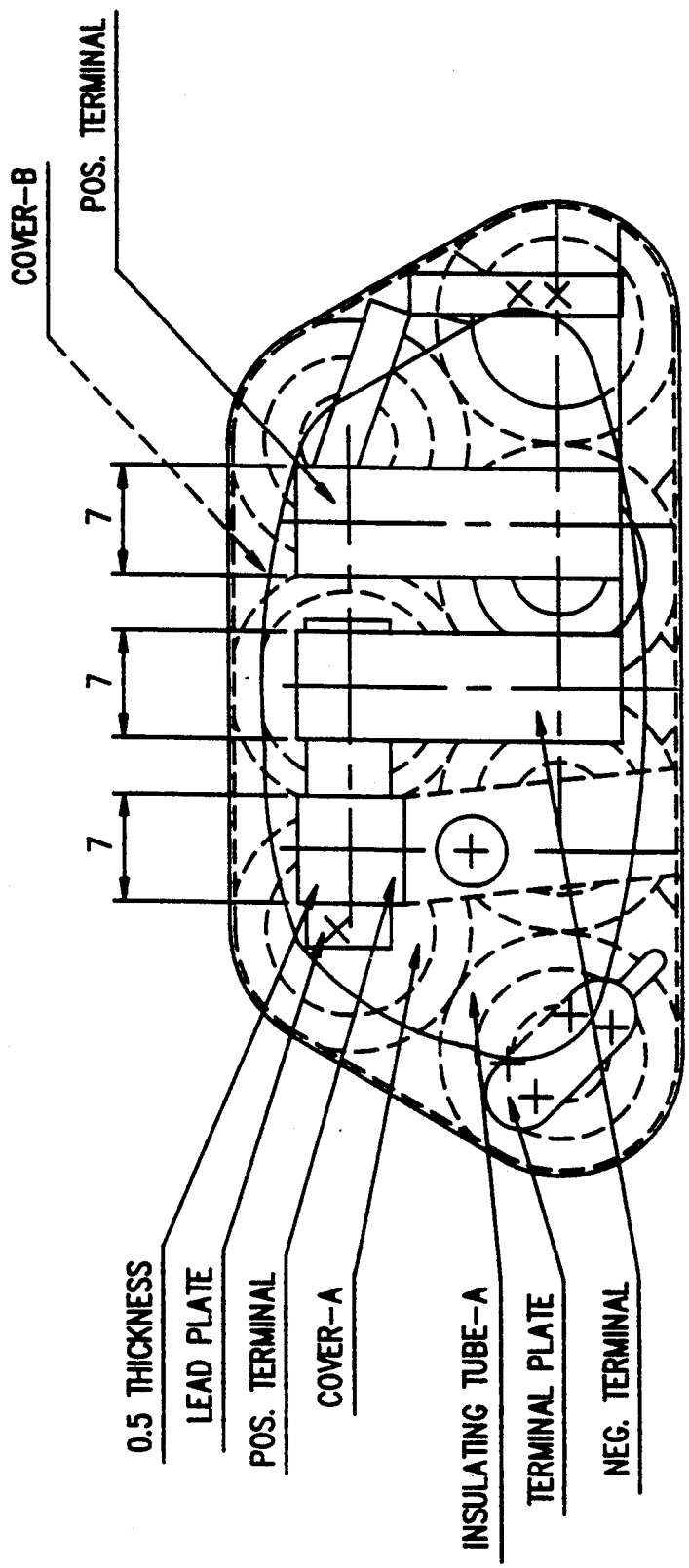
FIG. 7A shows the physical structure.
Figure 7B:
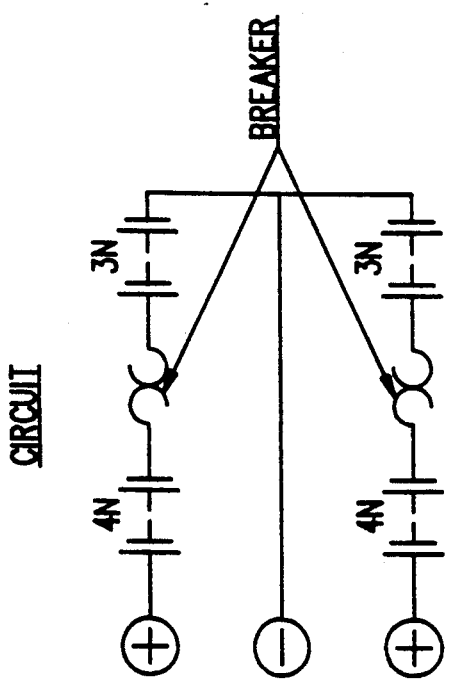
FIG. 7B shows the electrical connections, of the rechargeable battery module of the presently preferred embodiment, containing two electrically separate banks of 7 batteries each.

FIG. 7A shows the physical structure, and FIG. 7B shows the electrical connections, of the rechargeable battery module of the presently preferred embodiment, containing two electrically separate banks of 7 batteries each. Note that a fuse is included in the middle of each bank of batteries.

In the presently preferred embodiment, the battery module is configured as two banks of 7 Ni-Cd batteries in series. Thus, each bank provides a rated voltage of 8.4 Volts.

The battery sizes are selected, in the presently preferred embodiment, co provide a charge capacity of 1700 mA-hr for each bank; but of course the battery sizings could be changed if needed.

Connections for Power Supply and Management

Figure 2:
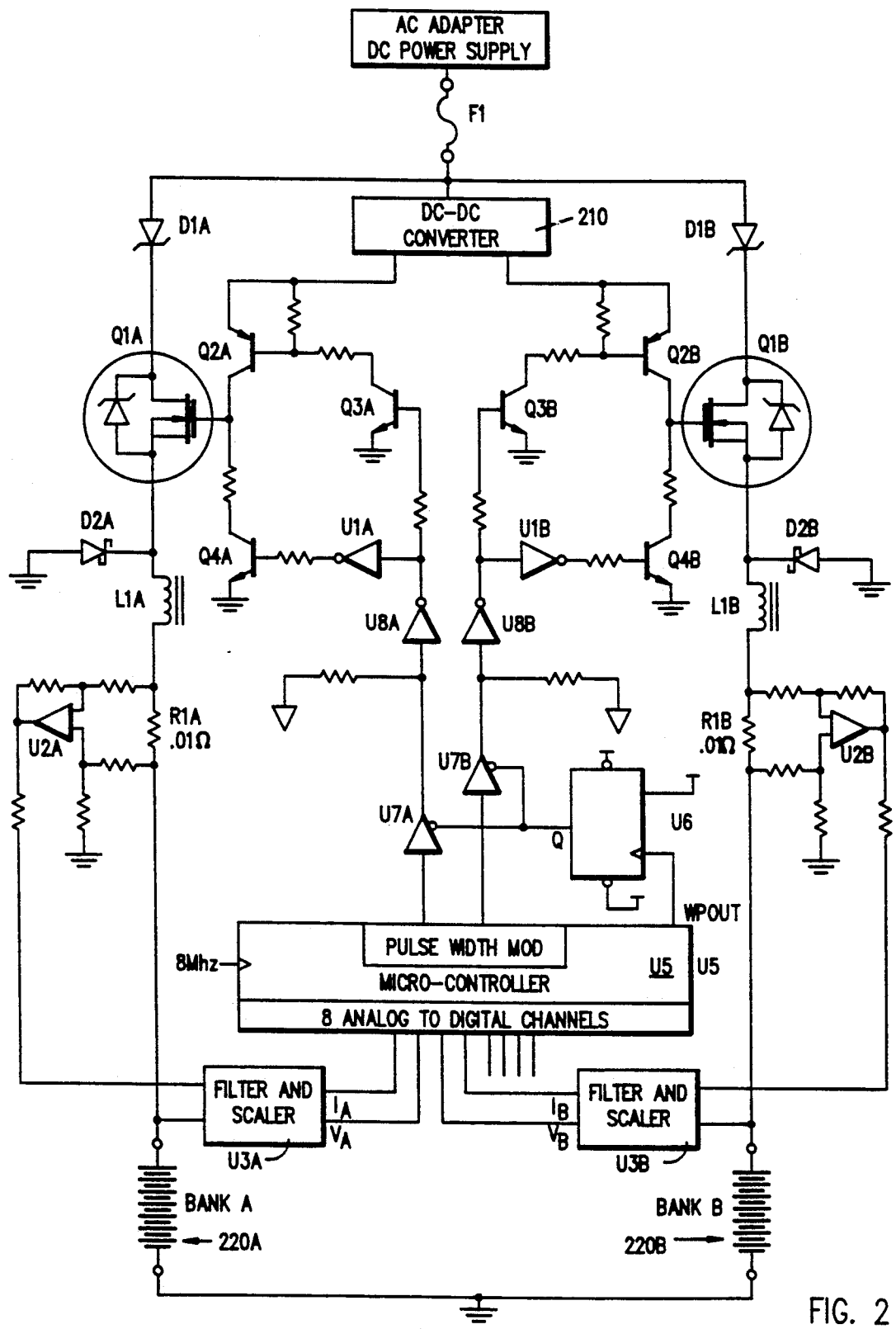
FIG. 2 shows the analog connections used, in the presently preferred embodiment, for monitoring the state of the two battery banks.
Figure 3A:
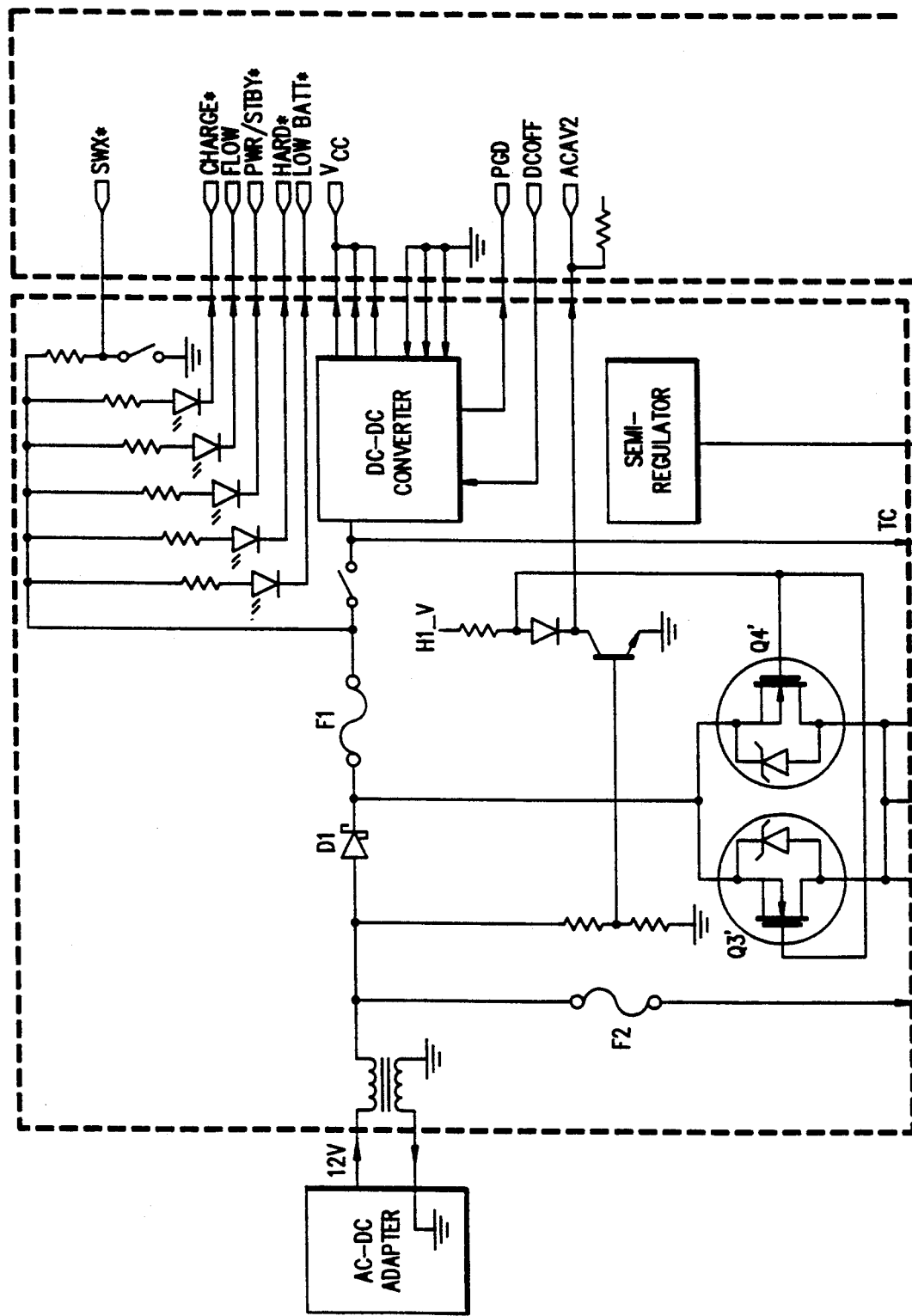
FIGS. 3a and 3b shows more details of the power-supply and power-control circuitry actually used, in the presently preferred embodiment.
Figure 3B:
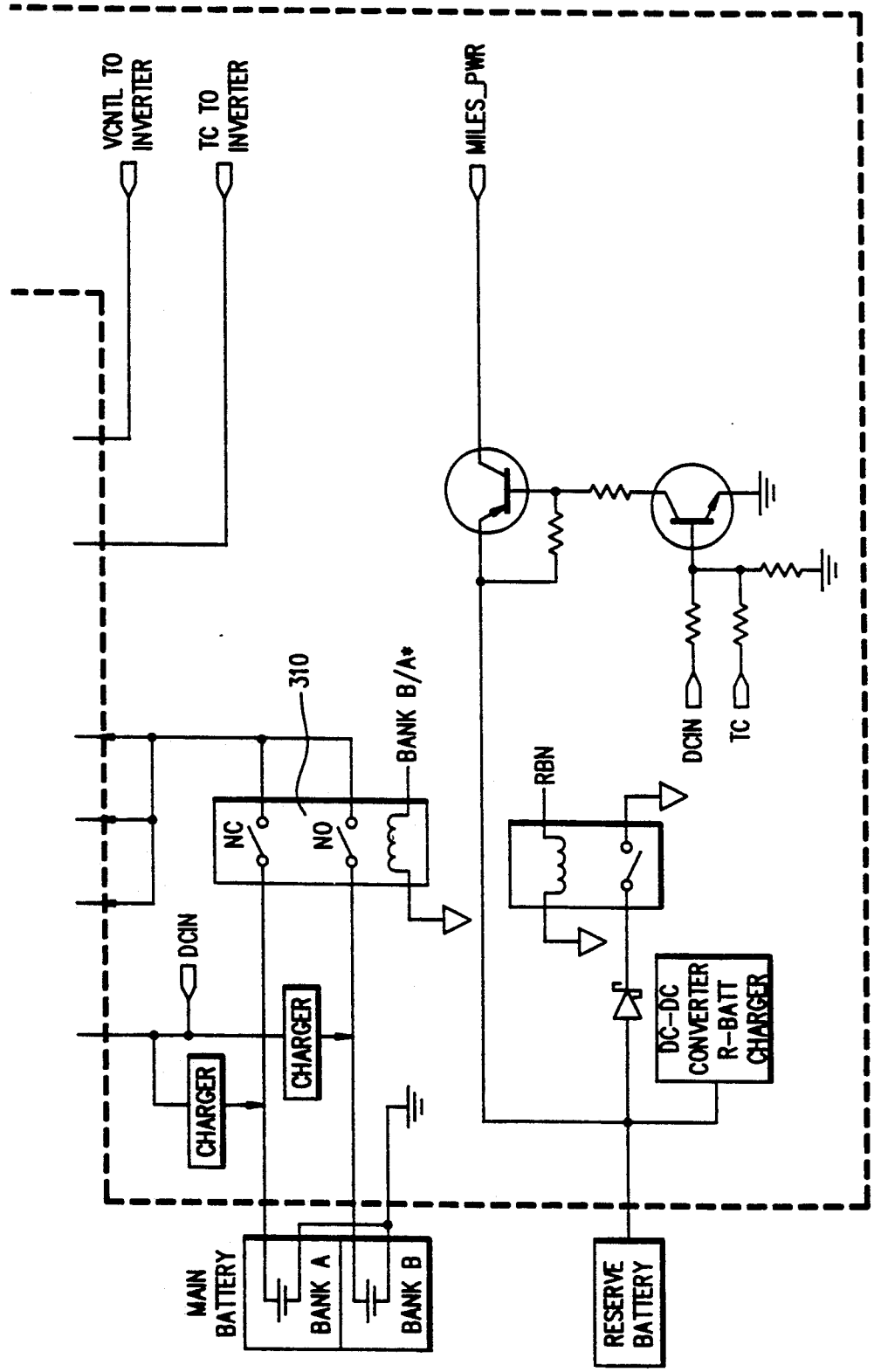
Figure 4A:
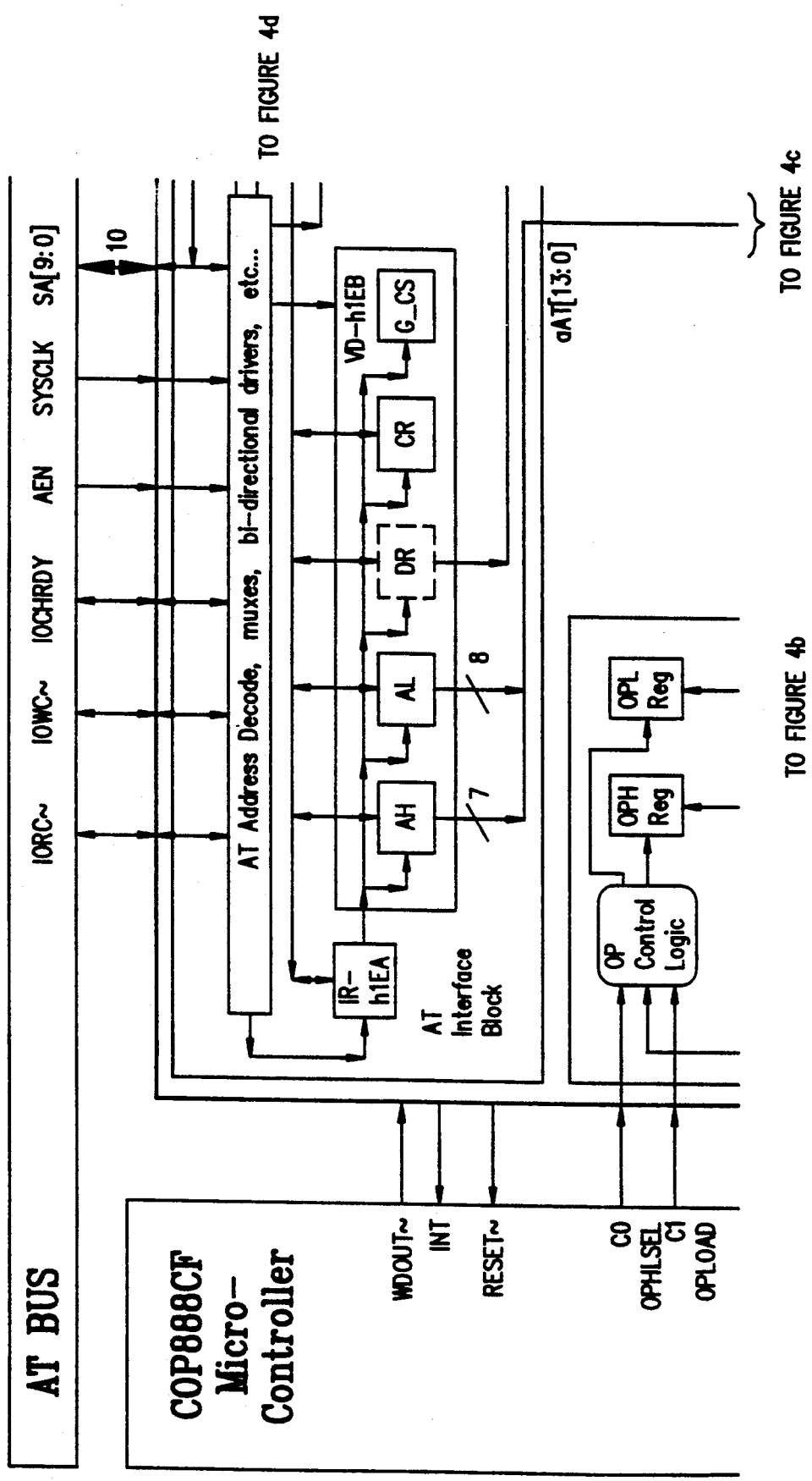
Figure 4B:
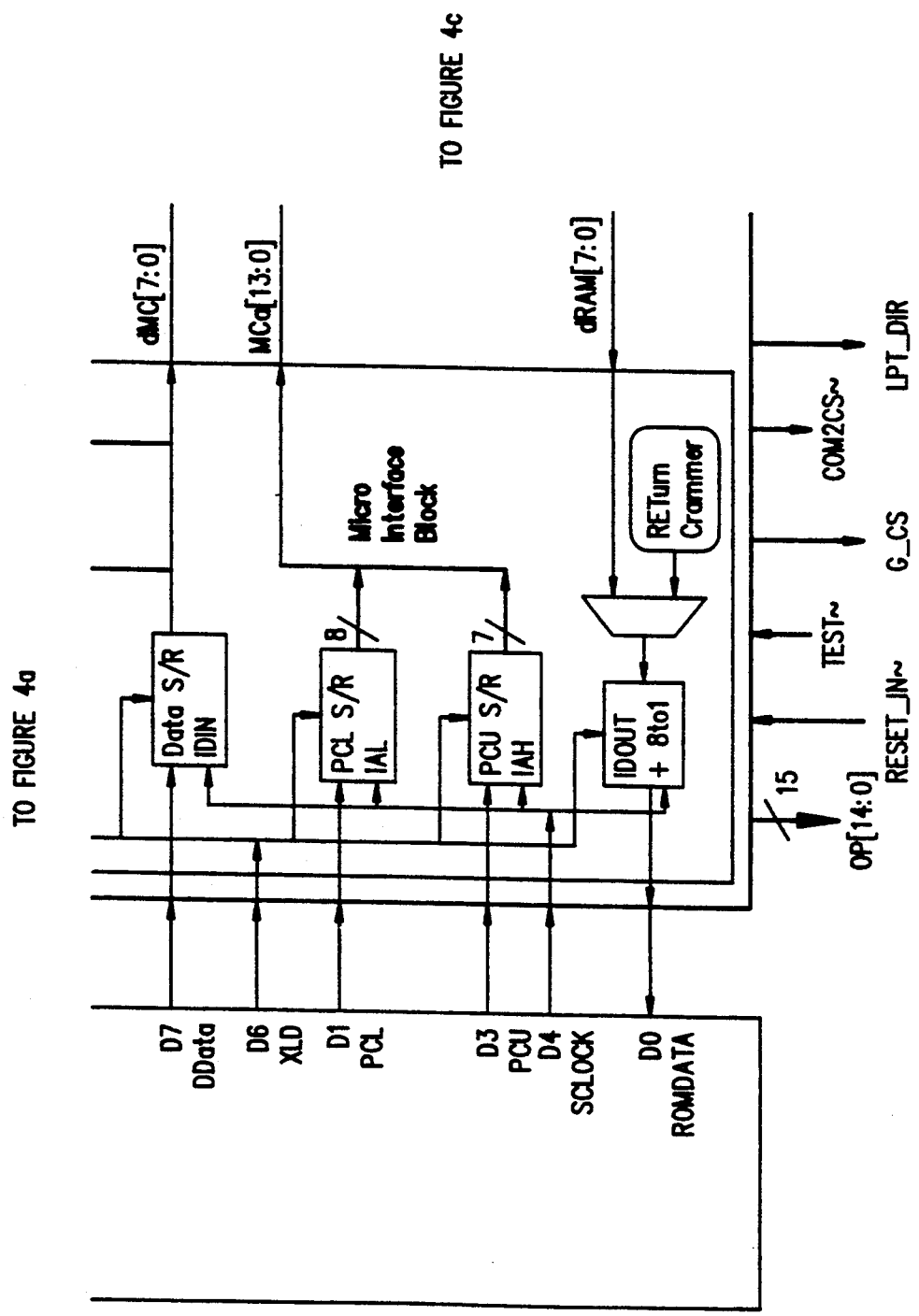
Figure 4D:
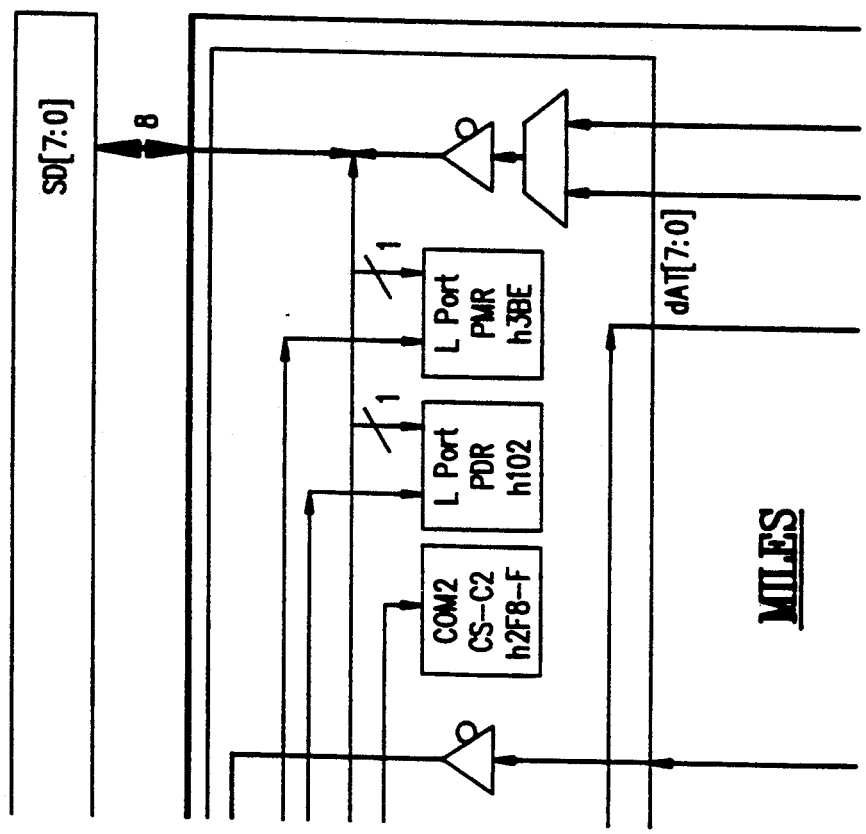

FIG. 2 shows the analog connections used, in the presently preferred embodiment, for monitoring the state of the two battery banks. FIGS. 3a and 3b show further details of the power-supply and power-control circuitry in the preferred embodiment.

The power system for any battery powered computer varies quite a bit from a standard desktop computer. The power system used in the presently preferred embodiment is unusual, even for battery powered systems. Power is available from several sources; the main battery, a reserve battery, and an AC to DC adapter which is external to the system. Power from the main battery and the AC to DC converter must be regulated to 5 volts through the DC to DC converter 210. This is located on the System Power Module 930, which is located along the back right hand wall of the case. The ON/OFF switch is also located on the SPM, and protrudes through the plastic case on the right side of the unit (as seen in FIG. 8A). Since the external AC to DC adapter and main battery are on a common node on the input to the DC to DC converter, the battery banks are protected from overcurrent from the AC adapter by diodes D1A and D1B. Diodes D1 can dissipate up to 900 mW at their 2 Amp nominal current draw. A significant dissipation results even when a low voltage drop Schottky Barrier diode is used. In the presently preferred embodiment, this power loss is reduced by shorting diodes D1 with a pair of FETs whenever there is no external power being supplied. (This circuit arrangement, with FET pair Q3' and Q4', may be seen in FIG. 3.)

The battery management circuitry, in the presently preferred embodiment, is centered around a National Semiconductor COP888CF microcontroller (shown as U5 in FIG. 2). This device has 8 analog inputs to an analog to digital converter, 2 timer outputs that can be set up as pulse generators, several digital I/O lines and internal program ROM. The microcontroller monitors both banks of batteries 220A and 220B for both the current through, and the voltage of, each string of 7 cells. (In the presently preferred embodiment, each battery bank includes seven KR-1700AE Ni-Cd cells, as shown in FIGS. 7A and 7B.) The microcontroller software applies a very short duty cycle pulse for a period of time to check that the battery is accepting the charge current properly, and is not shorted. Then, when the battery voltage reaches about 7 volts, the pulse width is increased until about 800 mA are being applied.

The microcontroller has a feature called the "Watchdog timer output". Through a fairly safe scheme, this output will generate a pulse on line WPOUT if the microcontroller is not executing its program property. If this occurs, U6 latches the condition, which tristates U7A and U7B. A pullup on the output causes the gate of Q1A and Q1B to be pulled to ground, shutting the charger's current path off to the battery. This provides a safe condition during reset, and a safe condition in case the microcontroller should fail.

The charge current is regulated through a pulse width modulation scheme in which Q1A and Q1B are switched at a frequency of about 10 kHz. The width of the pulse determines how much average current is allowed to flow through the battery. L1A and L1B are toroidal core inductors that prevent excessive amounts of current to be sourced from the ac adapter. The two diodes D2A and D2B provide negative current to flow through L1A and L1B after Q1A and Q1B are turned off, and the field induced in L1 collapses. Transistors Q3A and Q2A are turned on to allow the gate of Q1A to be pulled to the 21 volt level of the dc to dc converter. Op amp U2A is used as a differential amplifier across R1A (0.01 ohms) to obtain a signal $I_A$ which measures the current from battery bank 220A. The output of U2A is filtered and scaled by U3A, and is read by the microcontroller U5 through one of its analog to digital converter inputs. The pulse width is adjusted by the microcontroller U5 to maintain a constant current of about 800 milliAmps. U3A is also used to filter and prescale the battery voltage measurements, to produce an analog signal $V_A$ to U5. Signals $V_B$ and $I_B$ are similarly generated to measure the voltage and current of the other main battery bank 220B.

Q3 is turned on by the microcontroller pulse through U7 and U8. Turning on Q3 pulls the base of Q2 low, which causes it to conduct, allowing 21 volts to be supplied to the gate of the power FET, Q1. U1 inverts the signal from the microcontroller, turning Q4 off whenever Q3 is on. When the signal from the microcontroller goes inactive (high), the base of Q4 is driven high, causing Q4 to conduct and drain the gate capacitor of Q1 through a small resistor (about 220 ohms) to ground. This allows for a fast turn off and turn on time for the FET (Q1). Keeping Q1 in its non-linear region keeps it from becoming heated, so that no heat sink is needed for these FETs.

FIGS. 3a and 3b show some additional details of the power management circuitry. This circuitry is shown primarily for very full compliance with the best mode requirements of the U.S. patent law. Note, however, the relay 310, which switches back and forth between the two battery banks 220A and 220B.

POWER-MANAGEMENT PROGRAM

The following high-level pseudo-code shows the program structure which is a actually used, in the presently preferred embodiment, for power management.

Power On

Perform basic integrity check
Check power switch
If switch on go to NORMAL START
If switch off go to NORMAL CHARGE MODE

Normal Start

Turn on POWER ON led
Initialize port direction and interrupt registers
Initialize timers
Test for AC Available
Begin Normal Operation MAIN Loop

Main—(Normal Operation)

Monitor—Battery Voltage Standby Switch AC Available System ON switch and blink Charge LED if on Activity Lines (Reset timeouts when active) If Dynamic adjustment enabled reset HD and floppy timeouts during keyboard activity.

Timer Interrupt—5.12 msec.

Service Watch Dog Timer Register
Store current battery voltage
Compare with past for rapid drop detection
Compare with minimum absolute level
Compare with warning level Test alternate battery before activating alarm and switch batteries if indicated
Decrement Seconds Timer
Each Second:
  Decrement timeout counters
    Battery Change
    Hard Disk
    System Sleep
    Backlight Timeout
  If Beeper active
  Decrement pause counter and call BEEP
  Test and debounce standby switch Battery Detect Interrupt Switch to reserve battery
Start 2 minute timeout for system power off
Turn off LCD to reduce power consumption
If Floppy and HD not active, put system in standby mode
Accumulate reserve battery use time (After 1 minute of reserve on time, or one month of operation, the reserve charger will be enabled during the next battery charge cycle. After 2 minutes of use the reserve battery will be charged from the main battery if no AC is available.)
Monitor BDT* line for new battery installed to terminate function
Test new battery and switch reserve off if voltage good Battery Change Read current battery voltage
Read target battery voltage
Switch if alternate is same or higher Low-Power—1 Mode BEEP for 5 seconds (2 times every second) (COP should enable speaker on low volume if user has it off)
Turn on LOW BATTERY LED
Set Low Power 1 Flag Low-Power—2 Mode BEEP for 5 seconds (2 times every second) (COP should enable speaker on high volume regardless of the user setting)
Flash LOW BATTERY LED
Turn off LCD back light
Set CPU clock to slow speed
Set Low Power 2 flag
Enable keyboard interrupt and turn LCD backlight on with any key
Scan for presence of external power or new battery Low Poer—3 Mode Place main CPU in standby mode if not already there
Output continuous beep for 3 seconds
Save voltage reading for future comparison
Turn off the power module Power-On Alarm (Standby Switch Held Low for 5 Sec or More)

Exit immediately if external video active
LCD back light is turned off.
CPU clock speed goes to slow speed.
Flash Power On LED indicating Standby mode
A beep alarm is sounded if operating on batteries. (2 beeps every 4 minutes)

Monitor the standby switch to determine when the LCD panel is opened to exit this mode.
Exit standby immediately when the cover is opened.

Stand-By/Resume Key

Enter and exit standby when button lifted
CPU clock set to slow speed
LCD back light is turned off
CPU is placed in HOLD mode for minimum power consumption
POWER LED is flashing 0.5 sec on 2 sec off)
COP pulses the HT21 refresh line to refresh memory
Monitor the STAND-BY/RESUME key to exit standby mode
Exit hold for a fixed period on each timer interrupt to allow system time to be maintained.
Mask keyboard and mouse interrupts and have COP clear the keyboard controller buffer and restore the interrupt controller mask register before exiting standby.

Sleep Mode

Reduce clock speed to slow
Turn off LCD backlight
Enable keyboard interrupt
Monitor system activity (keyboard, ports, and restore full speed if any activity detected
If inactive for more than 1 minute and AC is available, begin Sleep Charge Mode
Allow Standby Key press to exit sleep mode Normal Charge Mode Turn on CHARGE led
If Reserve Charge Flag set, start reserve charge with 2.5 hour fail safe timeout
Minimum duty cycle for 3 minutes
Monitor voltage rise and current
If max voltage and no current then battery open
If current rise with no voltage then shorted
If OK gradually increase current to target value of 750 ma. Start fail safe timeout of 4 hours
Monitor voltage until it starts to decline or holds constant for xx minutes
If voltage reaches the power supply maximum then monitor the charge current watching for an increase or a constant value for xx minutes to indicate end of charge
When end conditions are reached shut off charging current Flash CHARGE led at a low duty cycle when charged
Wait 0.5 hour with charge off before resuming trickle charge on batteries to allow them to cool off from charge Sleep Charge Mode Turn on CHARGE led
Minimum duty cycle for 3 minutes
Monitor voltage rise and current
If max voltage and no current then battery open
If current rise with no voltage then shorted
If OK gradually increase current to target value of xxx ma. Start fail safe timeout of xx hours
Monitor voltage until it starts to decline or holds constant for xx minutes
If voltage reaches the power supply maximum then monitor the charge current watching for an increase or a constant value for xx minutes to indicate end of charge
Exit charge mode and start blink of CHARGE led before system exits sleep mode Flash CHARGE led at a low duty cycle when charged When end conditions are reached shut off charging current

Host BIOS Functions Post

Reset COP
Checksum MILES SRAM and compare version number
If necessary reload COP program
Start COP
Transfer setup parameters to SRAM and clear CDONE to interrupt COP
Check for proper operation of COP
Set processor to compatibility speed (per SETUP)
Turn on LCD backlight

Switch Displays

Send Display_Type command to COP (LCD/CRT)

Wait for Key (Int 16H function 0)

If no character is available issue a CPU-HOLD command to the COP

Setup

COP returns status of standby button, etc. to setup
Transfer interrupt mask to be used in standby to COP
Transfer parameters to COP before exiting setup

CTL/ALT4DEL (Soft Boot)

Place COP in reset before resetting CPU

External Program Interface

Verify power status before programming Flash Eproms
Enable reserve battery for Flash programming power backup The Appendix (not printed herein, but located in the patented file) shows a detailed implementation of the COP code to perform these functions,, in the presently preferred embodiment. However, the foregoing listing shows the key relations of the preferred program structure.

CPU AND BUS MANAGEMENT

The presently preferred embodiment provides two versions, differing primarily in the choice of CPU: one version with an Intel 80C286, and one version with an Intel 386SX.

The presently preferred embodiment relates to systems used in the ISA architecture. (Such systems are also referred to as systems which use the "AT bus.") however, it is alternatively possible to adapt at least some of the disclosed teachings to other architectures, such as EISA bus systems or to other buses which may find use in the future.

In the presently preferred embodiment, an HT21 chip, from Headland Technologies, is used to provide a variety of peripheral support functions to the main microprocessor. These include bus management, memory management, interrupt control, and DMA control. Additional information regarding this chip may be found in its data sheet, which is available from Headland Technologies, and which is hereby incorporated by reference.

Serial port management and keyboard interface are provided by an 82CI106 combination chip from VTI. Of course, other implementations of support logic and glue logic can be used if desired, within this well-known architecture.

In the presently preferred system embodiment, the BIOS is carried in flash EPROM. Thus, BIOS update requires erasing the flash EPROM. If power were lost while this operation were in progress, the machine would become nonfunctional. Therefore, in the presently preferred embodiment, the on/off switch is disregarded while flash EPROM reprogramming is in progress.

POWER-MANAGEMENT MICROCONTROLLER

A COP888CF microcontroller is used to perform the power-management functions, in the presently preferred embodiment. This microcontroller has an unusual feature: A/D converter circuitry is included on-chip, so that the chip can directly receive 8 channels of analog input. However, alternatively, other microcontrollers could be used, with off-chip converters or analog interface chips if desired.

THE MICROCONTROLLER INTERFACE CHIP ("MILES")

FIGS. 4a, 4b, 4c and 4d are a block diagram of the microcontroller interface chip, in the presently preferred embodiment. This figure shows significant signals which interface to the other chips, and also shows some important on-chip registers. The significance of these signals and registers will now be described.

The microcontroller interface chip (which is often referred to herein as "MILES") is an interface chip between the National Semiconductor COP888CF microcontroller, its SRAM for program memory, and the AT bus.

The Microcontroller Interface Chip allows the BIOS to download programs to the SRAM, and the COP888CF can thus execute in ROMless mode by fetching code from the SRAM. This is accomplished via a serial communication channel between the Microcontroller Interface Chip and the microcontroller.

The Microcontroller Interface Chip also allows the COP888CF to read and write to the AT bus, so that it can control the system clock speed register in the HT21 chip, etc. The AT bus also has the capability to perform I/O reads or writes to the SRAM while the COP888CF is executing code.

The COP888CF performs power management functions such as monitoring the battery level, turning off the display when not in use, and powering down the machine after programmable periods of inactivity.

The main function of the Microcontroller Interface Chip is to interface between COP888CF microcontroller, an external SRAM, and the AT bus (which is driven by the HT21 chip by Headland Technologies).

FUNCTIONAL BLOCK DEFINITIONS

MILES at Bus Interface Block

This interface (schematically shown in FIGS. 4a, 4b, 4c and 4d) controls the AT address, data, and control signals (IORC~, IOWC~, AEN, IOCHRDY) when executing AT I/O cycles to the Microcontroller Interface Chip. Note: a tilde ~ following a signal name is used conventionally to indicate an inverted or active-low signal. This interface handles both slave and master cycles on the AT bus by providing an intelligent state machine. This state machine keeps track of AT cycles as well as tristating the address/data busses and control signals. Address bits are be latched, and data bits are not latched, on slave cycles (i.e., when an AT master is writing to the SRAM). Data is read from or written directly to the SRAM.

MILES COP888CF Microcontroller Block

This interface (schematically shown in FIGS. 4a and 4b) includes a serial/parallel shift register for both the address and the data paths. The SRAM address is supplied from the AH and AL registers. The COP888CF always provides the address and data serially, and expects to receive the data requested serially on the next cycle. As will be described later, COP888CF reads from certain addresses are treated as Exception Cycles by the Microcontroller Interface Chip.

The microcontroller address is first shifted into the Microcontroller Interface Chip serially via the COP888CF D port pins D1 and D3 and then, depending on the cycle type, is passed to the SRAM or the AT bus. The COP888CF read data is then latched in the Microcontroller Interface Chip and shifted serially into the D0 pin of the microcontroller while the D port write data is shifted into the Microcontroller Interface Chip from the D7 pin and redirected to the SRAM, or the AT bus.

This block also includes two 8-bit control registers which can be loaded from the output data from the D7 pin of the microcontroller. Fifteen of these status bits are output directly to MILES output pins to control various external devices. The remaining bit selects either 1) AT I/O cycles or 2) SRAM or Register cycles for the COP888CF Exception Cycles. (See Sect 1.3.4.)

MILES External SRAM Block

This interface (schematically shown in FIG. 4c) generates the SRAM control signals (OE~, WE~, CE~) as well as tristating the data bus during SRAM read cycles. Internal handshake signals, between the SRAM, the microcontroller and the AT bus, are mainly decode signals to distinguish between cycle types. The SRAM interface is compatible with 8K×8 memory as well as 32K×8.

MILES State Machines

The Microcontroller Interface Chip Gate Array includes two state machines: 1) a Slave state machine, and 2) a Master (Exception Cycle) state machine.

The Slave state machine tracks any AT bus cycles to the SRAM and generates the AT system data (SD) tristate enables. It also monitors the AT signals SA, IOWC~, IORC~, and AEN to distinguish between read and write cycles. It also generates IOCHRDY to insert wait states on the Microcontroller Interface Chip Slave I/O cycles to SRAM until the COP888CF is finished accessing the SRAM. This prevents conflicts between microcontroller accesses and AT accesses to the SRAM.

The second state machine, the Master state machine, controls all Exception Cycles. This includes microcontroller writes to the SRAM, the Microcontroller Interface Chip Master I/O cycles to the AT Bus, and the Set CDONE Bit cycles. This state machine drives the necessary AT control signals and busses required for the Master I/O cycles (SD, SA, AEN, IOWC~, and IORC~).

MILES Miscellaneous Block

This block includes latches for control signals (IOWC~, IORC~, IOCHRDY). It also includes logic to generate the state machine reset signal when the microcontroller is HALTed since the COP888CF Shift Clock does not clock during HALT. It also includes the slave state machine time out signal generated from a 3-bit counter.

MILES Register Definitions

AT Bus Interface Registers

These four registers and one chip select are the only Microcontroller Interface Chip registers that appear in the AT address space. The address in the table heading is the AT address.

Index Register (IR): AT Address: h1EA

| X | X | X | X | X | Index Value |
|---|---|---|---|---|---|

The Index Register (IR) is an 8-bit index into the Internal Interface Registers (IIR) of the Microcontroller Interface Chip. When the AT bus master reads or writes to the Virtual Data Register (VD), it accesses the (IIR) indicated by the contents of the (IR). Only bits 2-0 are implemented. All other bits will be read as zeroes. Writing to bits 7-3 has no effect. On RESET_IN~ low, this register is set to zero.

Virtual Data Register (VD): AT Address: h1EB

| Virtual Data |
|---|

The Virtual Data Register (VD) is an 8-bit port into the (IIR) of the Microcontroller Interface Chip. When the AT bus master accesses the (VD), it actually accesses the (IIR) indicated by the current value of the (IR).

Parallel Port Direction Register (PPD): AT Address: h3BE,SD5

| X | X | PPD | X | X | X |
|---|---|---|---|---|---|

The Parallel Port Direction Register (PPD) is a single-bit register used in conjunction with the Parallel Port Mode Register (PPM) to control the direction of the Parallel Port. When the (PPM) is set for Extended Mode Operation, this register controls the LPT_DIR pin out of the Microcontroller Interface Chip. When the (PPM) is set for Compatibility Mode Operation, then the LPT_DIR pin is always forced high (i.e., the Port is always an output) and the (PPD) has no effect on the port. Only bit 5 is implemented. Writing to any other bits will have no effect. This register cannot be read from the Microcontroller Interface Chip. When this address is read, the Microcontroller Interface Chip will not drive the SD bus; another device may drive the data (but not necessarily). On RESET_IN~ low, this register is set to zero.

Parallel Port Mode Register (PPM): AT Address: h102,SD7

| EMODE~ | X | X | X | X | X | X |
|---|---|---|---|---|---|---|

The Parallel Port Mode Register (PPM) is a single-bit register used to set the Mode of Operation of the Parallel Port. When bit 7, SD[7], is written low, the port is set to Extended Mode operation. When bit 7 is written high, the port is set to compatibility mode operation, with the port configured as an output. Writing to any other bits will have no effect. In the presently preferred embodiment, only bit 7 is implemented. This register cannot be read from the Microcontroller Interface Chip. When this address is read, the Microcontroller Interface Chip will not drive the SD bus, another device may drive the data (but not necessarily). On RESET_IN~ low, this register (bit 7 only) is set to one.

EMODE~ = 1 ——> LPT_DIR = HIGH
EMODE~ = 0 ——> LPT_DIR = PPD~

COM2CS~, (C2) Modem Chip Select: AT Address: h2F8-h2FF

The COM2CS~ (C2) is a direct decode of the above AT addresses. Whenever there is an I/O read or write in this address range, the COM2CS~ pin on the Microcontroller Interface Chip will be driven low. All other times it is inactive high. The Microcontroller Interface Chip does not drive onto the SD bus during these accesses. Reset has no effect.

MILES Internal Interface Registers (IIR)

These four registers are used to generate and control AT read and write accesses to the SRAM. They are accessed indirectly from the AT bus by writing the address f the desired register into the (IR) and performing a read or write cycle to the (VD) Register.

Address High Register (AH): AT Address: h1EB

| X | A14 | A13 | A12 | A11 | A10 | A9 | A8 |

The Address High Register (AH) contains the 7 high order address bits of the 14-bit address to be applied to the SRAM. During AT I/O reads or writes to the SRAM, the contents of this register are input to address pins A8-A13 of the SRAM. A14 is output on pin OP14 if it is enabled by the A14EN bit in the Control Register. The AH register does not increment after access to the Data register. The unused bit (7) is not implemented and will be read as a 0. Writing to the unused bit has no effect. The AH Register is undefined after RESET_IN~ goes low.

Address Low Register (AL): AT Address: h1EB

| A7 | A6 | A5 | A4 | A3 | A2 | A1 | A0 |

The Address Low Register (AL) contains the 8 low-order address bits of the 13-bit address to be applied to the SRAM. During AT I/O reads or writes to the SRAM, the contents of this register are input to address pins A0-A7 of the SRAM. During SRAM accesses, the AL register auto increments as an 8-bit counter. The register is incremented at the completion of an access to the Data Register. The AL Register is undefined after RESET_IN~ goes low.

Data Register (DR): AT Address: h1EB

| D7 | D6 | D5 | D4 | D3 | D2 | D1 | D0 |

The Data Register (DR) is the data port to the SRAM for AT Master and Slave I/O cycles. Since the AL register auto-increments, sequential reads can be accomplished by multiple reads from the DR. Likewise, sequential writes to SRAM can be accomplished by multiple writes to the DR. The DR does not actually latch data; it is a data port between the Microcontroller Interface Chip and the AT.

Control Register (CR): AT Address: h1EB

| X | X | X | X | A14EN | WDOUT~ | RST~ | CDONE |

The Control Register (CR) contains 4 bits which control or contain information about the state of the Microcontroller Interface Chip gate array. The unused bits (7-4) are not implemented and will be read as 0's. Writing to the unused bits has no effect. The Control Register bits are described on the following page:
The Microcontroller Interface Chip Control Register (CR) bits are defined as follows:
  A14EN: A14EN controls whether A14 is output form port OP14 during SRAM accesses.
    This allows the upper 16 k of a 32 k×8 SRAM to be used.
  1-A14 output on OP14.
  0-A14 not output on OP14.
  0 is the RESET_IN~ value.
  WDOUT~: WDOUT~ reflects the value of the WDOUT~ signal from the COP888CF.
  WDOUT~ can be set/cleared in three ways:
    1) set to 1 by writing a 1 to the WDOUT~ bit in the Control Register.
    2) set to 1 by asserting the RESET_IN~ pin low.
    3) cleared to 0 by asserting the WDOUT~ pin from the microcontroller. The COP888CF asserts a pulse when the WatchDog times out; it does not hold it.
  RST~: The RST~ bit controls the RESET~ output to the COP888CF microcontroller. When RST~ is low, the COP888CF is held in reset and AT I/O cycles to the (DR), and SRAM accesses will complete with no wait states. When RST~ is high, the COP888CF will be executing code, and AT I/O cycles to the (DR) may have wait states inserted by IOCHRDY while the Microcontroller Interface Chip waits for the proper time in the COP888CF instruction cycle to access the SRAM.
  1—the RESET~ output pin is driven high (deasserted)
  0—the RESET~ output pin is driven low (asserted)
  0 is the RESET_IN~ Value (the Microcontroller Interface Chip Reset)
  CDONE: The Controller DONE bit is a handshake bit between the AT host and the COP888CF microcontroller. The COP888CF will set this bit to indicate that it has performed the action requested by the AT host. To indicate that it wants the COP888CF to perform an operation, the AT host should load a command into the SRAM, clear the CDONE bit, and poll the CDONE bit to see when the COP888CF has completed executing it. When the Microcontroller Interface Chip sees the CDONE bit has been cleared, it asserts INT (interrupt) to the COP888CF. The interrupt handling routine will fetch the command from SRAM, execute it, and then execute the set CDONE Exception Cycle setting the CDONE bit which deasserts the INT signal. The CDONE bit can be set/cleared in four ways:
1) Set when RESET_IN~ is asserted.
2) Set when MC_RST~ bit is asserted.
3) Set by the COP888CF via Exception Cycle.
4) Cleared by an AT I/O write of 0 to the CDONE bit.

Generic Chip Select (GCS) AT Address: h1EB

Index: b100

An I/O read or write to this address will cause pin GCS~ (Generic Chip Select) to be asserted low while IOWC~ or IORC~ is asserted.

MILES COP888CF Internal Only Registers

These registers are part of the serial interface to the COP888CF and are not directly accessible to the AT channel.

Internal Address High register (IAH): (No AT Address)

| X | A14 | A13 | A12 | A11 | A10 | A9 | A8 |

The Internal Address High register (IAH) contains the upper byte of the address the COP888CF shifted out of the D3 pin. This address will be combined with the IAL register and presented to the SRAM or AT Address Bus, depending on the cycle.

Internal Address Low register (IAL): (No AT Address)

| A7 | A6 | A5 | A4 | A3 | A2 | A1 | A0 |

The Internal Address Low register (IAL) contains the lower byte of the address the COP888CF shifted out of the D1 pin. This address will be combined with the IAH register and presented to the SRAM or AT Address Bus, depending on the cycle.

Internal Data Out register (IDOUT): (No AT Address)

| D7 | D6 | D5 | D4 | D3 | D2 | D1 | D0 |

The Internal Data Out register (IDOUT) is written with the COP888CF D-port data. It is serially shifted out of the D7 pin at the same time as the address. This data is the microcontroller output data for all microcontroller write cycles to the SRAM or AT channel.

Internal Data In register (IDIN): (No AT Address)

| D7 | D6 | D5 | D4 | D3 | D2 | D1 | D0 |

The Internal Data In register (IDIN) contains the byte of data that was read from the SRAM and will be shifted into the D0 pin of the COP888CF.

Internal Output Port High register (OPH): (OP Register)

| IO_M~ | OP14 | OP13 | OP12 | OP11 | OP10 | OP9 | OP8 |

The Internal Output Port High register (OPH) and the Internal Port Low register (OPL) and internal registers that are controlled by the C1 and C0 pins of the COP888CF C-port. On XLD, if C1=1, the data from the IDOUT register is latched into the OP register indicated by the C0 bit. The IO_M~ bit is a dedicated control bit. During Exception Cycles, it selects either 1) I/O read/write cycles or 2) SRAM Writes or Set CDONE Bit cycles. All the other bits are output on the OP[14:8] pins. When RESET_IN~ goes low, the OPH register is cleared to all zeros.

Internal Output Low register (OPL): (OP Register)

| OP7 | OP6 | OP5 | OP4 | OP3 | OP2 | OP1 | OP0 |

The Internal Output Port Low register (OPL) and the (IOH) register are internal registers that are controlled by the C1 and C0 pins of the COP888CF C-port. On XLD, if C1=1, the data from the IDOUT register is latched into the OP register indicated by the C0 pin. All the OPL bits are output on the OP[7:0] pins. When RESET_IN~ goes low, the OPL register is cleared to all zeros.

Internal Address Compare register (IAC): (No AT Address)

| A14 |

The Internal Address Compare register (IAC) is loaded with the value of the upper bit of the IAH register, bit 14, on COP888CF Exception Cycles. It is then compared with each subsequent cycle's bit 14 and will prevent the exception action (SRAM write for example) from repeating if there is a match. This will continue until the first compare fails, at which time normal operation will resume. The reason for this is to prevent multiple Exception Cycles from being generated erroneously. When the COP888CF generates a subroutine call to an address with bit 14 set, it will generate a read to that address. The Microcontroller Interface Chip will recognize this and jam a RET(urn from subroutine) instruction into the input data pin, D0, of the COP888CF. While the microcontroller is executing this instruction, it will continue to prefetch data from the location of the bogus subroutine. Since the Microcontroller Interface Chip will ignore these fetches, it will not generate additional Exception Cycles. While the IAC is active during Exception Cycles, the IAH and IAL bits 0–13 will be latched until A 14 is cleared to prevent the AT address from changing during AT I/O Exception Cycles.

MILES Cycle Definition

MILES Slave I/O Read/Write Cycles to MILES Registers (AT is Master)

MILES Slave I/O reads and writes to the Microcontroller Interface Chip Internal Interface Registers (IIR) are accomplished by accessing the AT Interface Registers at address h1EA and h1EB, using the appropriate index as was described above.

MILES Slave I/O Read/Write Cycles to MILES SRAM (AT is Master)

When an AT device initiates an I/O read or write to the Microcontroller Interface Chip' SRAM, it must supply the appropriate indices to provide the memory address which will be latched in the AL and AH registers in the Microcontroller Interface Chip. These addresses are then passed to the SRAM. During the data phase of the cycle (when the DR is indexed), the AT state machine in the Microcontroller Interface Chip will immediately drive and hold IOCHRDY low until the SRAM is available for access by the AT device. IOCHRDY will then be released and the cycle completed. After every access to the DR, the AL is auto incremented in the Microcontroller Interface Chip. (NOTE: Data for slave cycles is never latched in the Microcontroller Interface Chip.) For no wait state reads or writes (i.e., loading SRAM with code or for executing a quick check sum on the SRAM), the RST~ bit should be asserted low prior to initiating the slave block reads or writes. When RST~ is asserted, the microcontroller will be held in reset so that the AT state machine in the Microcontroller Interface Chip will not drive IOCHRDY to insert waits.

Microcontroller Read from SRAM

When the COP888CF microcontroller reads from the SRAM, it generates the address via its D1 and D3 pins serially through the Microcontroller Interface Chip to tile SRAM. The SRAM data will then be shifted serially out of the Microcontroller Interface Chip into the COP888CF via pin D0.

Microcontroller Write to OP Registers

When the COP888CF wants to write a value to the OPH or OPL registers, it should write that value to its D port into the Microcontroller Interface Chip IDOUT register. It should then write the appropriate control value to the C port. When XLD is asserted at the end of a microcontroller SRAM read cycle, if C I of the C port is high, the 8-bit OP latch indicated by the C0 bit will be open. The input data for the OP registers is the IDOUT register. When XLD is deasserted, the latch will close and retain the data from the IDOUT register which is driven out the corresponding OP pins of the Microcontroller Interface Chip.

Microcontroller Exception Cycles

These are special cycles that are implemented by the Microcontroller Interface Chip. The COP888CF initiates an Exception Cycle by performing a subroutine call to the top 16 K of its Program Memory Map; e.g., address bit 14 is set. The Microcontroller Interface Chip will recognize the address as an indication of an Exception cycle and stuff a RET(urn from subroutine) instruction into the IDIN register. The Microcontroller Interface Chip then takes whatever action is indicated by the exception during the next serial code fetch from the COP888CF.

To the COP888CF, it will appear that the first instruction of the routine is a return and it will pop the old PC off its internal stack and continue to execute instructions after the subroutine call.

Since the COP888CF takes 5 cycles to complete the RET instruction, and since it will prefetch instructions from the virtual subroutine it thought it jumped to, the Microcontroller Interface Chip will ignore all subsequent cycles to the exception space until it sees a microcontroller read from SRAM cycle. This will prevent the Microcontroller Interface Chip from taking erroneous exceptions while still allowing back-to-back Exception Cycles by the COP888CF code.

The Exception Cycle Memory Map is as follows:

| IO_M~ | A14 | A13 | A12 | A11 | Action |
|---|---|---|---|---|---|
| 1 | 1 | 0 | X | X | Master I/O Read |
| 1 | 1 | 1 | X | X | Master I/O Write |
| 0 | 1 | 0 | X | X | SRAM Write |
| 0 | 1 | 1 | X | X | Set CDONE bit |
| X | 0 | X | X | X | SRAM Read |

IO_M~, is a control bit in bit 7 of the OPH register. It selects between: 1) I/O read/write cycles and 2) SRAM or Set CDONE Bit cycles. It is the microcontrollers' responsibility to set this bit to the proper value prior to initiating the Exception Cycle.

For ALL Exceptions Cycles, the COP888CF must first acquire the AT bus by asserting DMA_REQ (DMA request) and waiting for DMACK (DMA acknowledge). It must then assert MASTER~ for proper execution of the I/O cycle.

MILES Master I/O Read

During a MILES Master I/O Read from the AT bus, the microcontroller provides the address for the AT bus on the ten low-order bits of the Microcontroller Interface Chip IAH and IAL registers. The lower 13 address bits control where the data read from the AT bus will be stored in SRAM. The highest order bit, A14, indicates to the Microcontroller Interface Chip that this is an Exception Cycle and its decode, along with the IO_M~ bit from the OPH register, indicates which Exception Cycle. The AT data will flow directly into the SRAM without being latched in the Microcontroller Interface Chip. The microcontroller then accesses that data by reading the SRAM at the same location where the AT data was stored.

MILES Master I/O Write

During a MILES Master I/O Write to the AT bus, the microcontroller will shift the address into the Microcontroller Interface Chip IAH and IAL registers which will then drive the AT address. The AT bus state machine will write the data from the IDOUT register to the AT data bus. The COP888CF should have written the intended AT write data to its D-port before executing the Exception Cycle.

Microcontroller Write to SRAM

Address and data are shifted into the Microcontroller Interface Chip serially to generate the SRAM address and data. The Address is collected in the IAH and IAL registers as ft)r reads, the Data is collected in the IDOUT register. The COP888CF should have written the intended AT write data to its D-port before executing the Exception Cycle. the Microcontroller Interface Chip will stuff a RET(urn from subroutine) instruction into the IDIN register and complete the write during execution of the RET.

Microcontroller Set CDONE Bit

When the Microcontroller Interface Chip detects a read to the address for the Set CDONE Bit Exception, it will cram a RET (return from subroutine) instruction into the IDIN register and set the CDONE Bit in the Control Register, also clearing the COP888CF Interrupt previously set when CDONE was cleared.

Sample Specific Circuit Implementation

The actual circuit implementation of the presently preferred embodiment will now be described in very great detail. However, it must be noted that the drawings shown are actual engineering drawings, and therefore include a great deal of detail. Most of the signal names on these drawings correspond to those discussed above, but the significance of the others will be readily apparent to those skilled in the art of digital design.

FIGS. 6a, 6b, 6c, 6d, 6e and 6f are a diagram of the microcontroller interface chip, in the presently preferred embodiment. Note that this diagram is somewhat more detailed, in certain respects, than the diagram of FIGS. 4a, 4b, 4c and 4d.

Figure 5B:
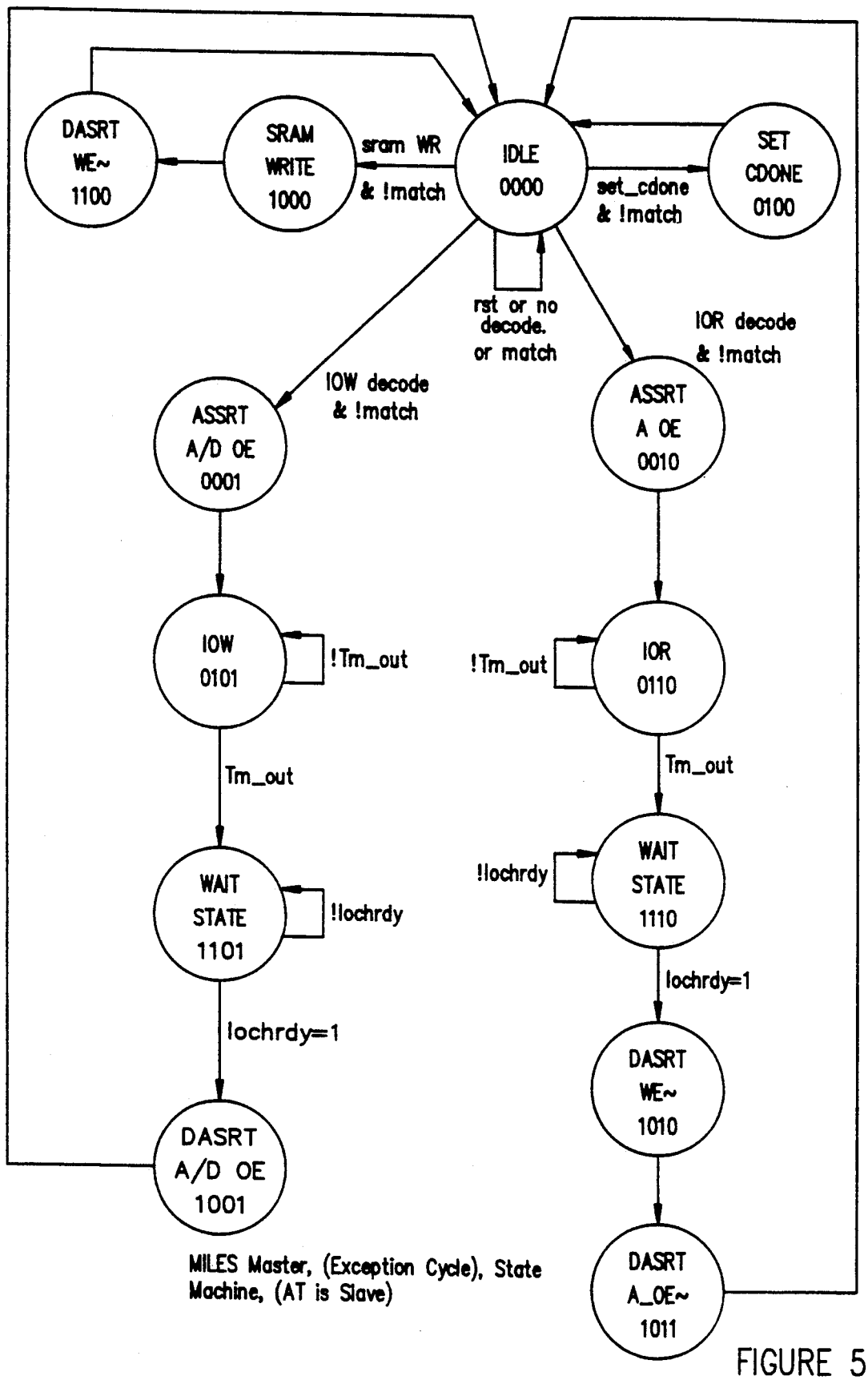
FIG. 5B is a state diagram which shows the operation of a second state machine, in operations where the microcontroller interface chip is accessing the system bus as master.
Figure 6A:
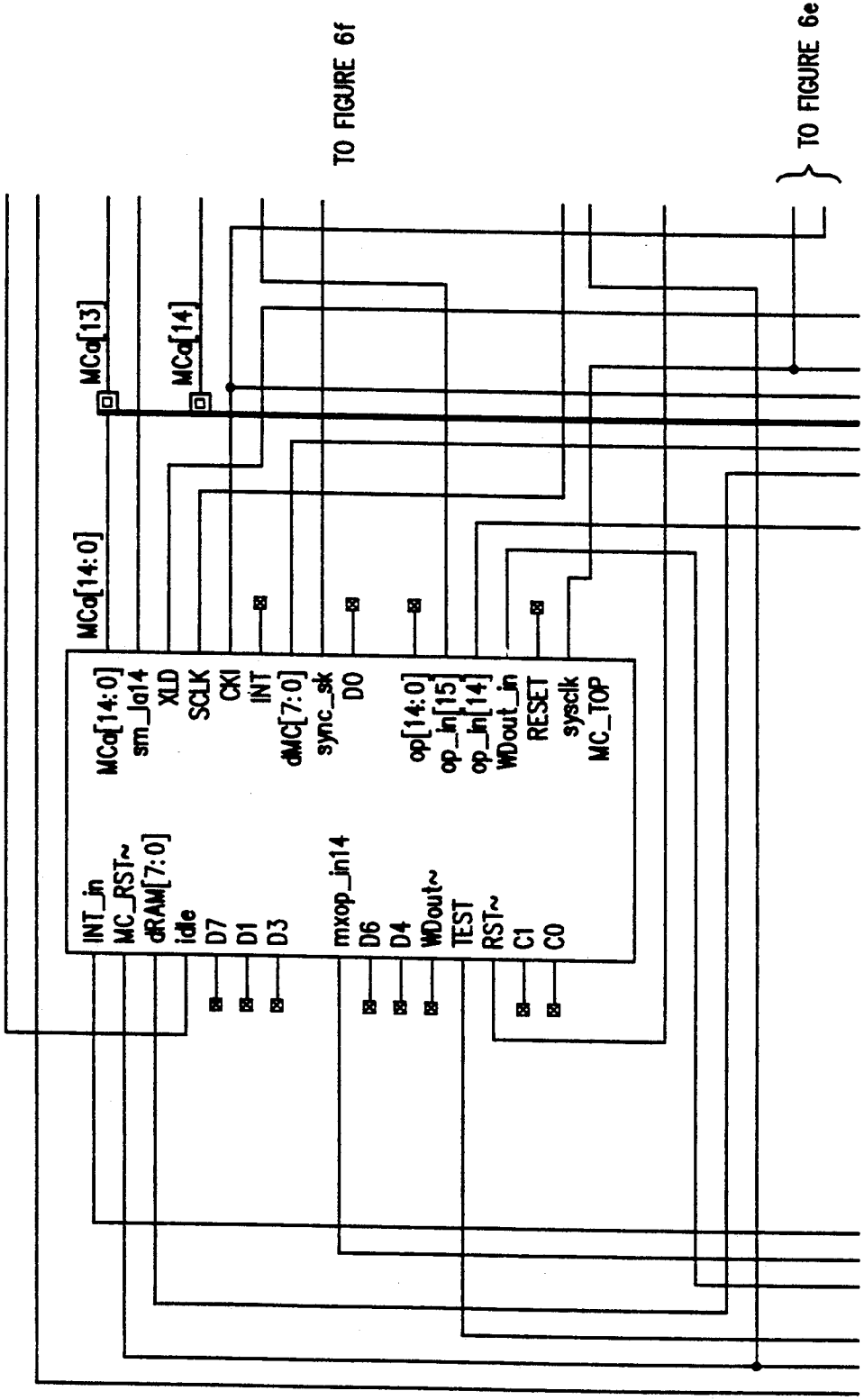
FIGS. 6a, 6b, 6c, 6d, 6e and 6f are a diagram of the microcontroller interface chip, in the presently preferred embodiment. Note that this diagram is somewhat more detailed, in certain respects, than the diagram of FIGS. 4a, 4b, 4c and 4d.
Figure 6B:
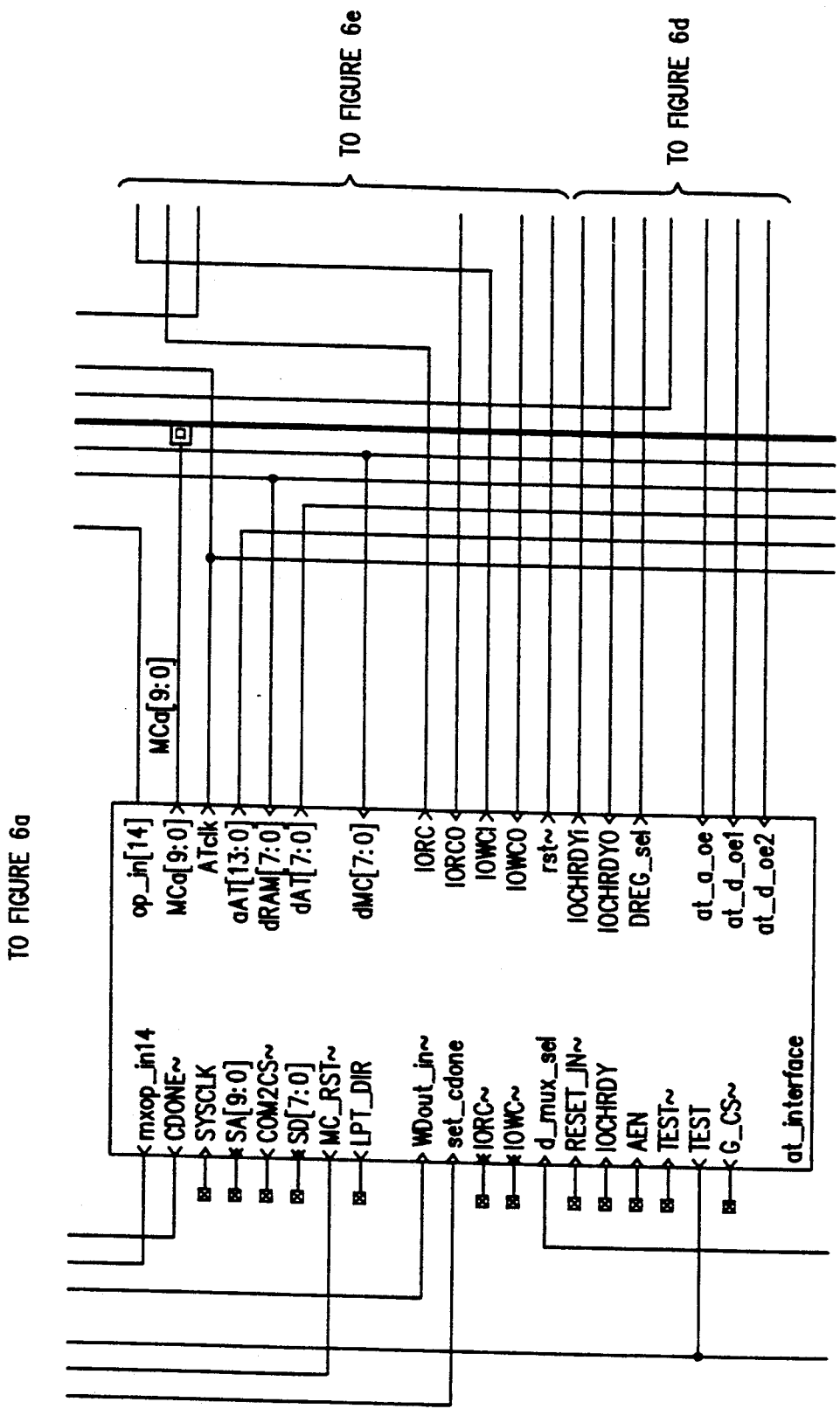

The at_interface block provides the interface to the AT bus, and is shown in more detail in FIGS. 6Ba and 6Bb. The atmas lock is a state machine, for accessing the AT bus as master, and corresponds to the state diagram of FIG. 5B. The atslv block is a state machine, for accessing the AT bus as slave, and corresponds to the state diagram of FIG. 5A. The misc_blk block is shown in detail in FIG. 6D. The MC_TOP block provides the interface to the microcontroller, and is shown in more detail in FIG. 6A.

FIG. 6A is a diagram of the MC_TOP block shown in FIG. 6a, and FIG. 6A-1 is a diagram of the MC_intfc block shown in FIG. 6A. The block mc_pads merely represents pads and pad drivers. Block ret_mux8 is an 8-bit-wide multiplexer, which implements the return-cramming function: if line RET_SEL is low, data from the program memory will be selected; if line RET_SEL is high, data from the return crammer memory will be selected. Block cdata_reg is simply a double register, which multiplexes the in byte onto the a and b bytes. Blocks lat15 and lat8 are latches. Block sclk_cnt3 is a 3-bit counter, which counts 8 sclock signals and then generates a LEN signal on the folowing sclock edge. Block s2p_reg8 is simply a serial-to-parallel register, and p2s_blk is a parallel-to-serial converter. Block addr_sr is a shift register for address conversion.

FIGS. 6Ba and 6Bb are a detailed diagram of the at_interface block shown in FIG. 6b. Block decode is simply a decoder, which implements tests for signal values as described above. Block SDpad is an 8-bit bidirectional interface (with registers) to I/O pads, and block SApad is a simple 10-bit bidirectional pad interface. Block at_regs is simply a large collection of registers.

FIG. 6B-1 is a detailed diagram of the index block shown in FIGS. 6Ba and 6Bb. This block shows the logical used to implement four WR~ bits, and the resulting Boolean relationships.

Figure 6C:
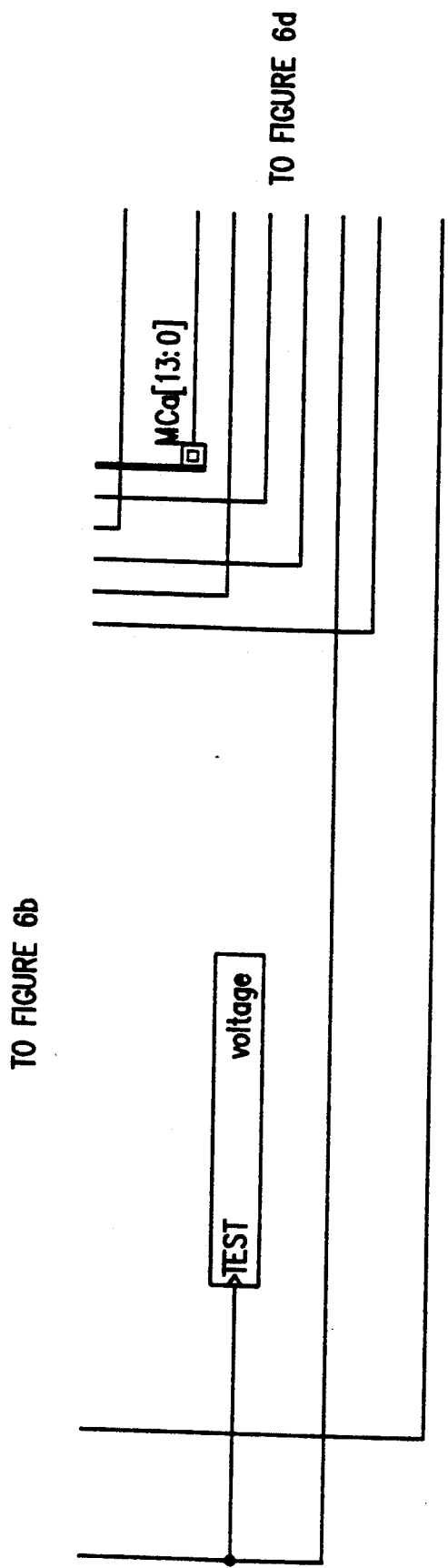
Figure 6D:
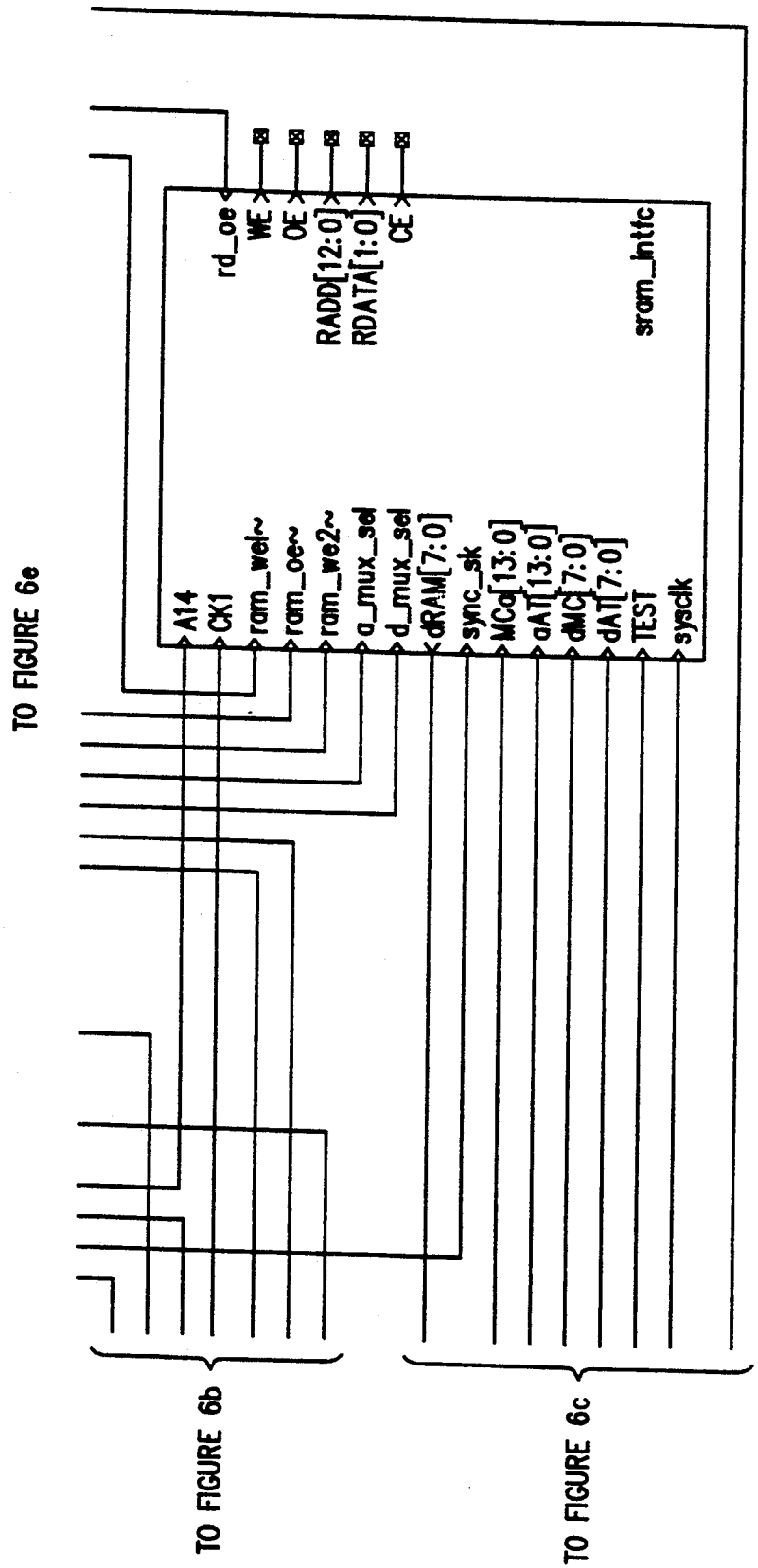

FIG. 6C is a detailed diagram of the sram_intfc block shown in FIG. 6d, which implements the SRAM interface.

Figure 6E:
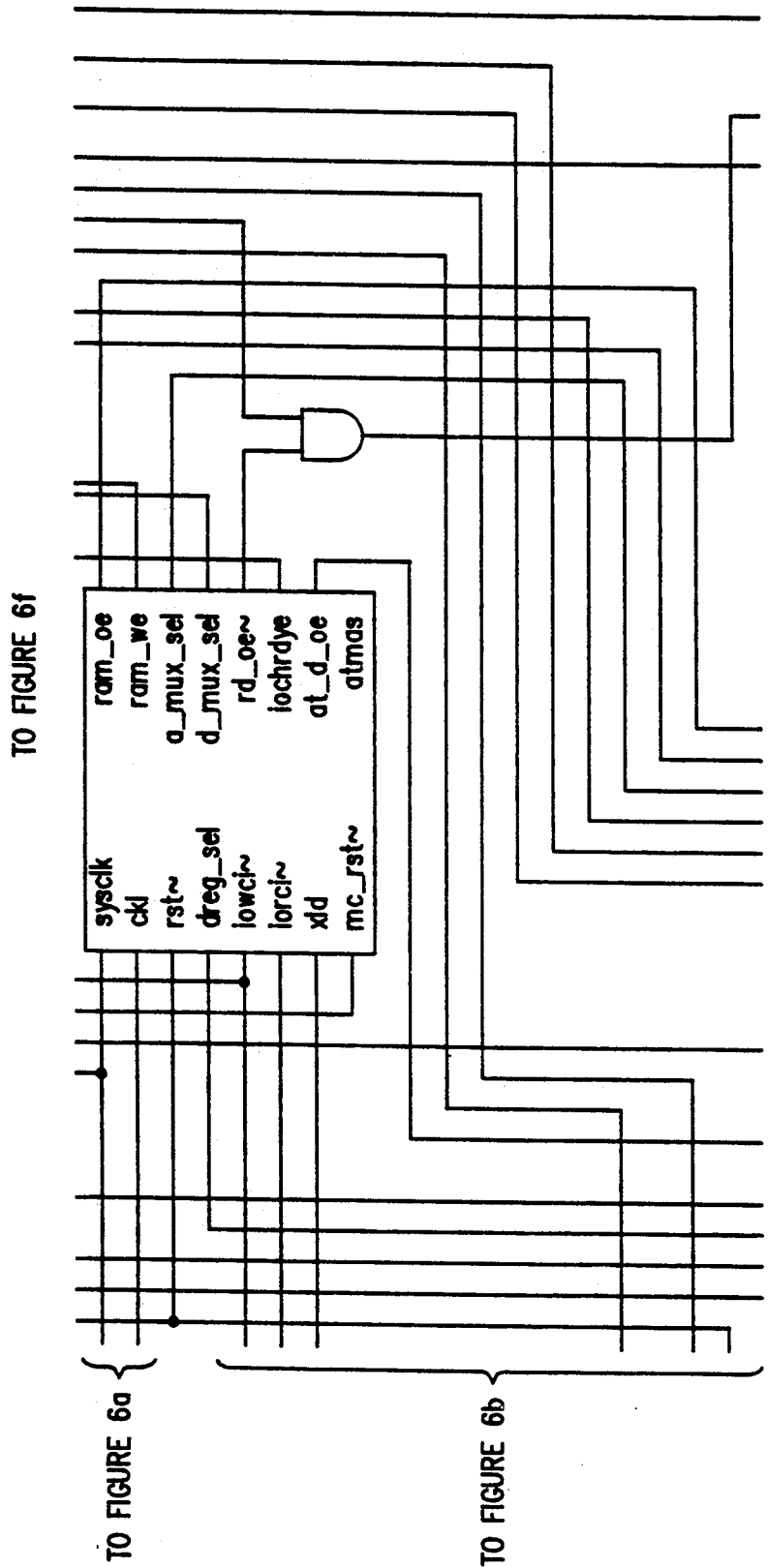
Figure 6F:
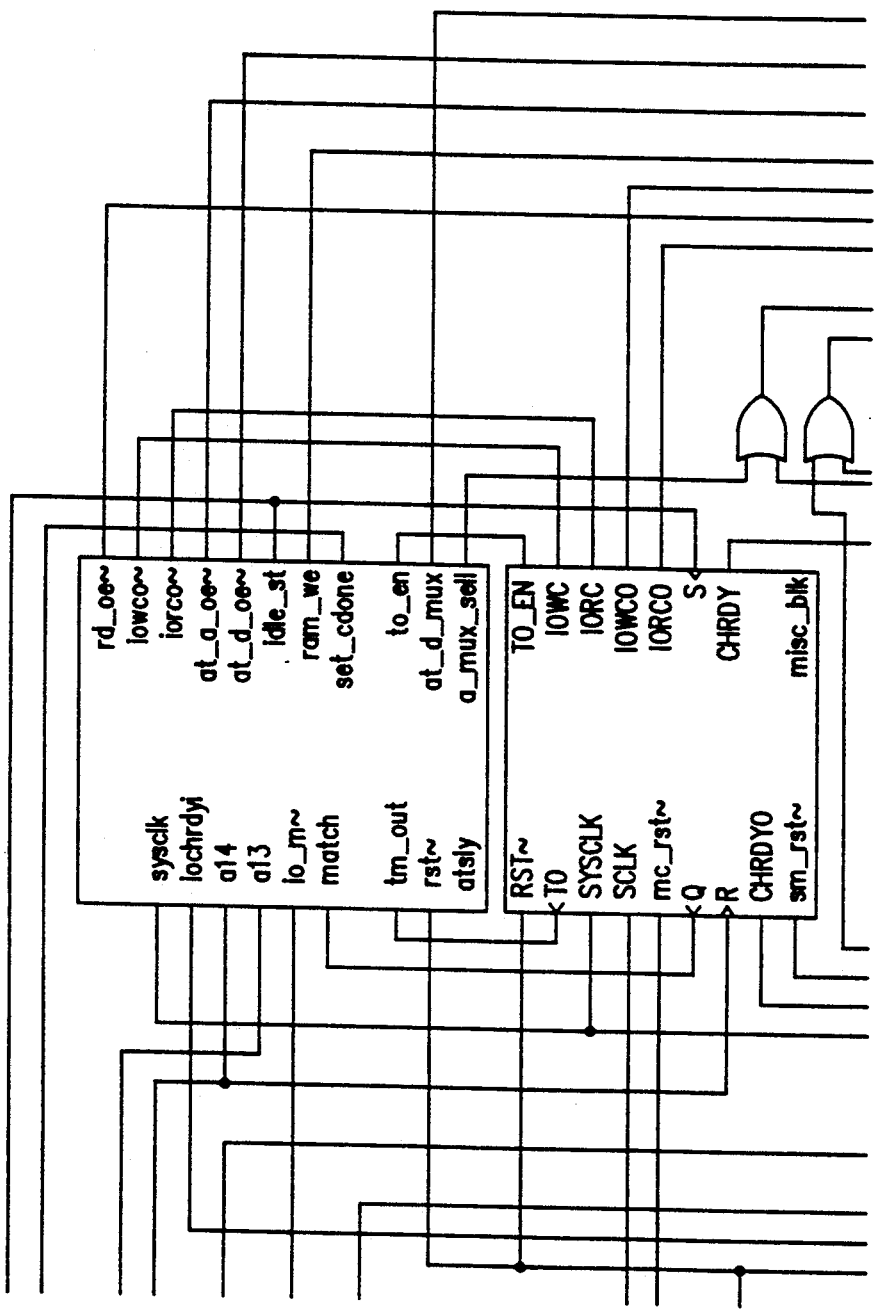
Figure 6A:
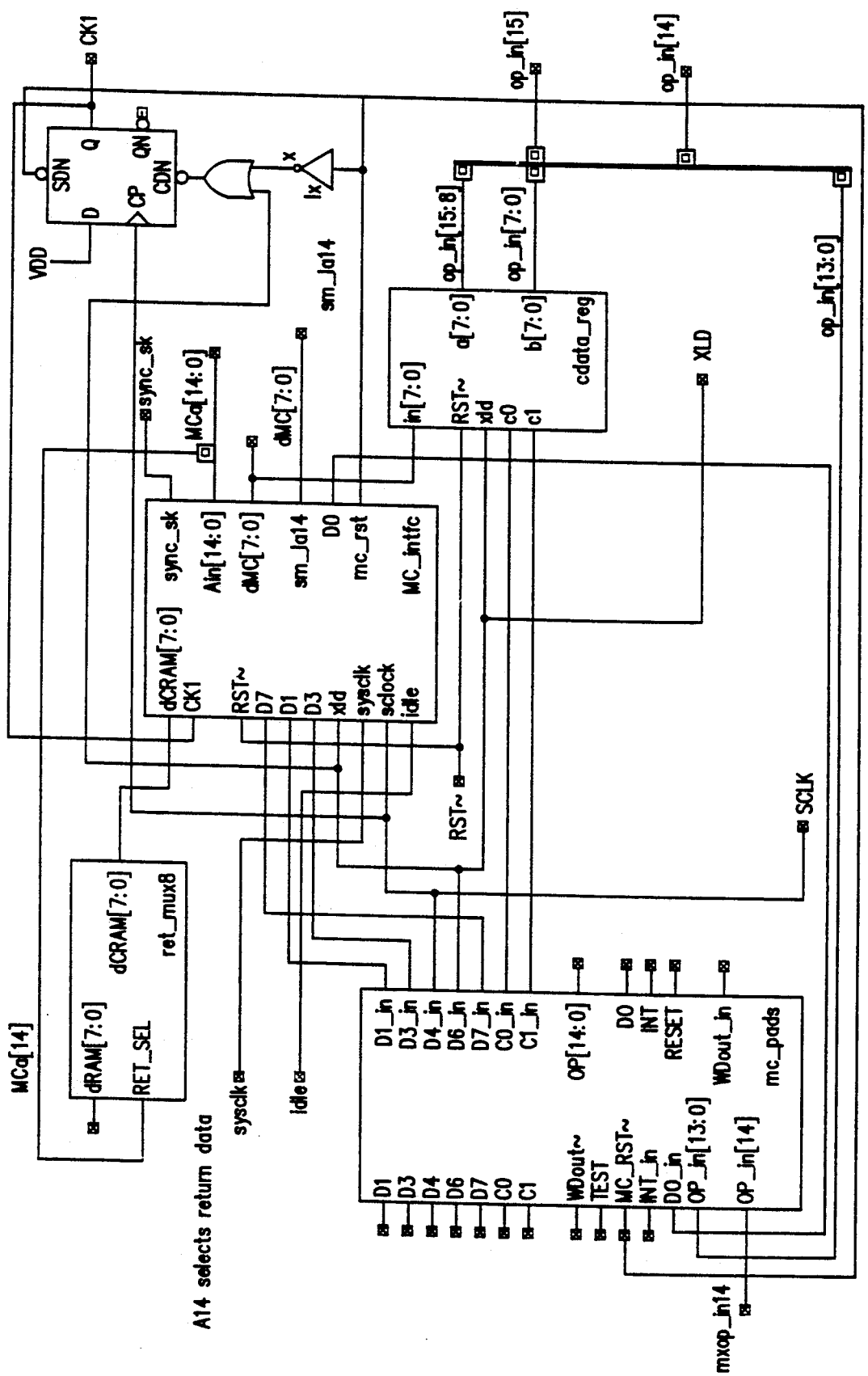
Figures 1, 6A:
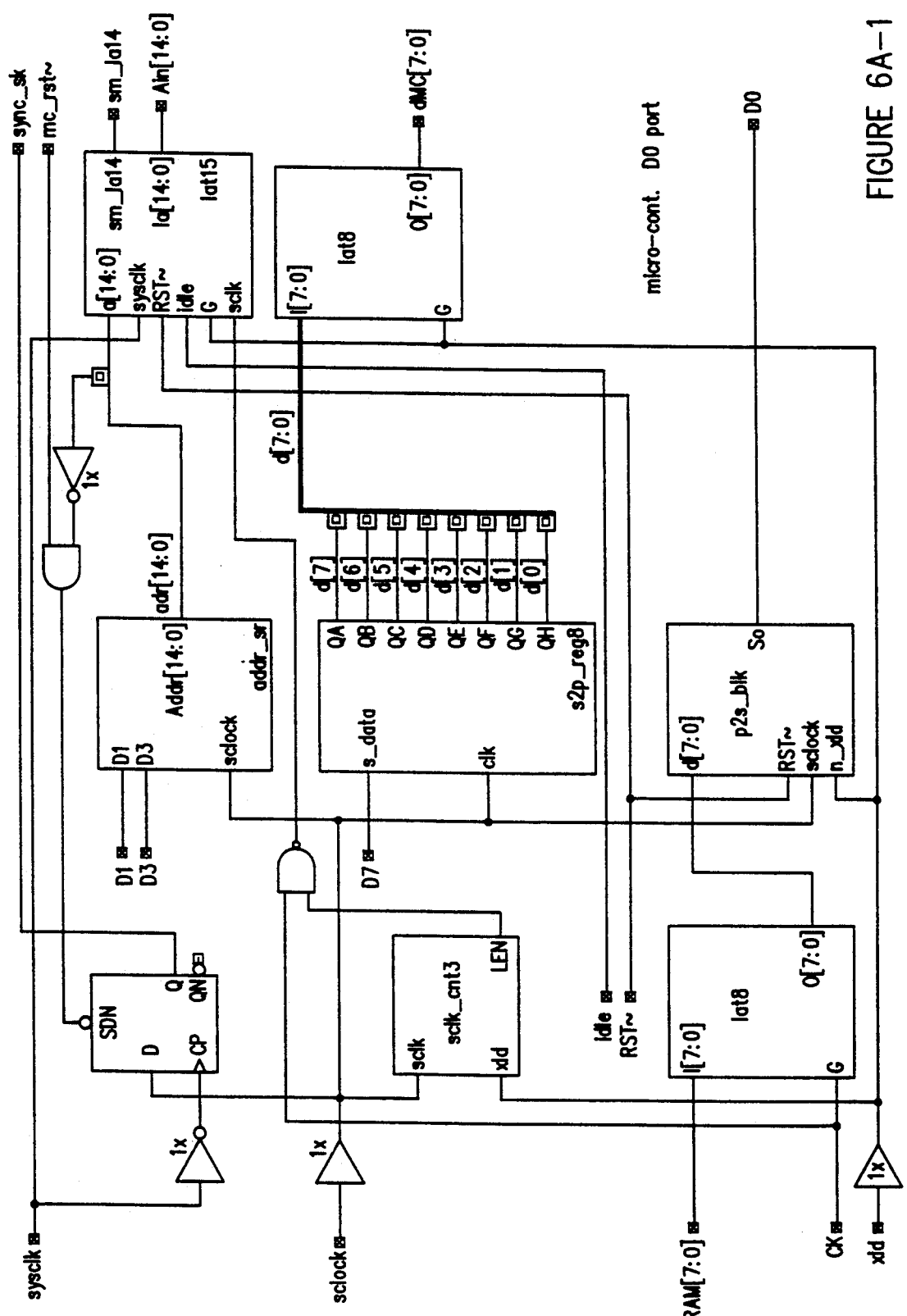
Figure 6B:
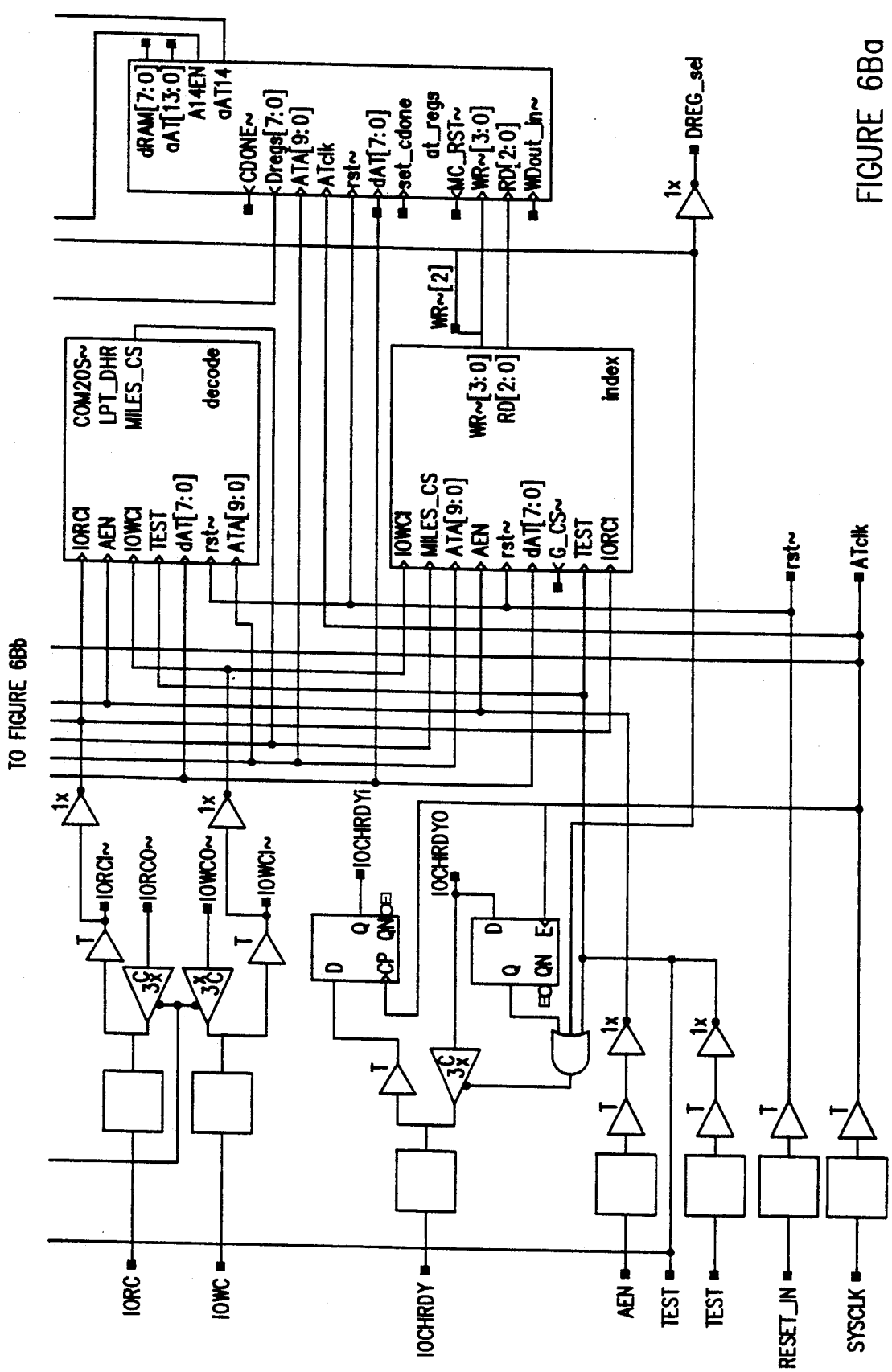
Figure 6B:
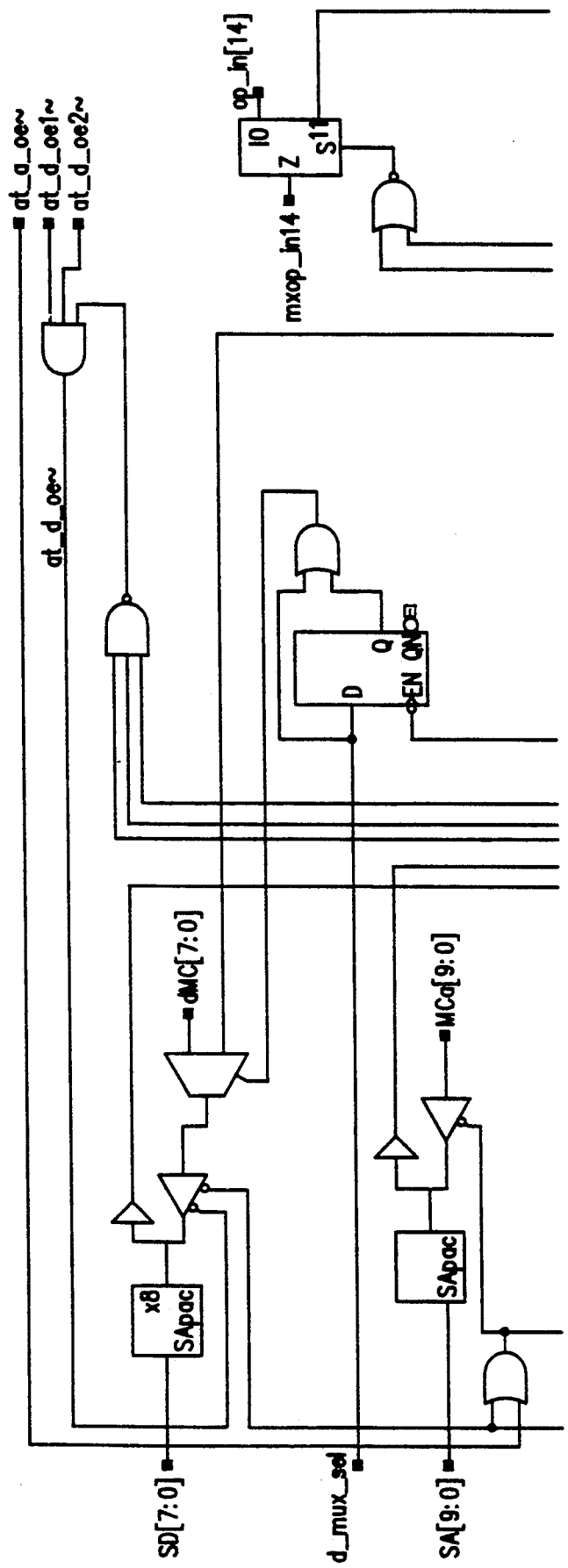
Figures 1, 6B:
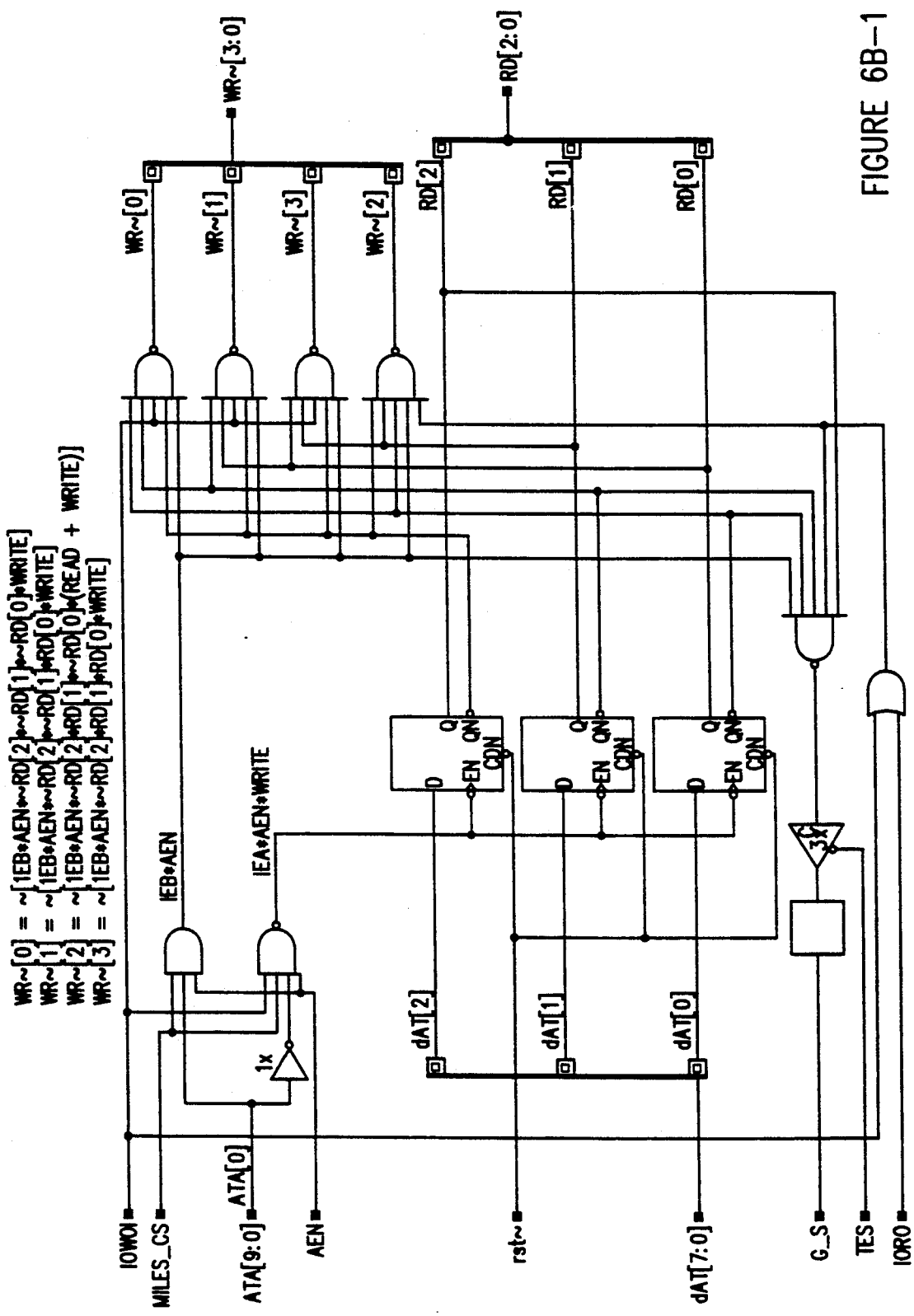
Figure 6C:
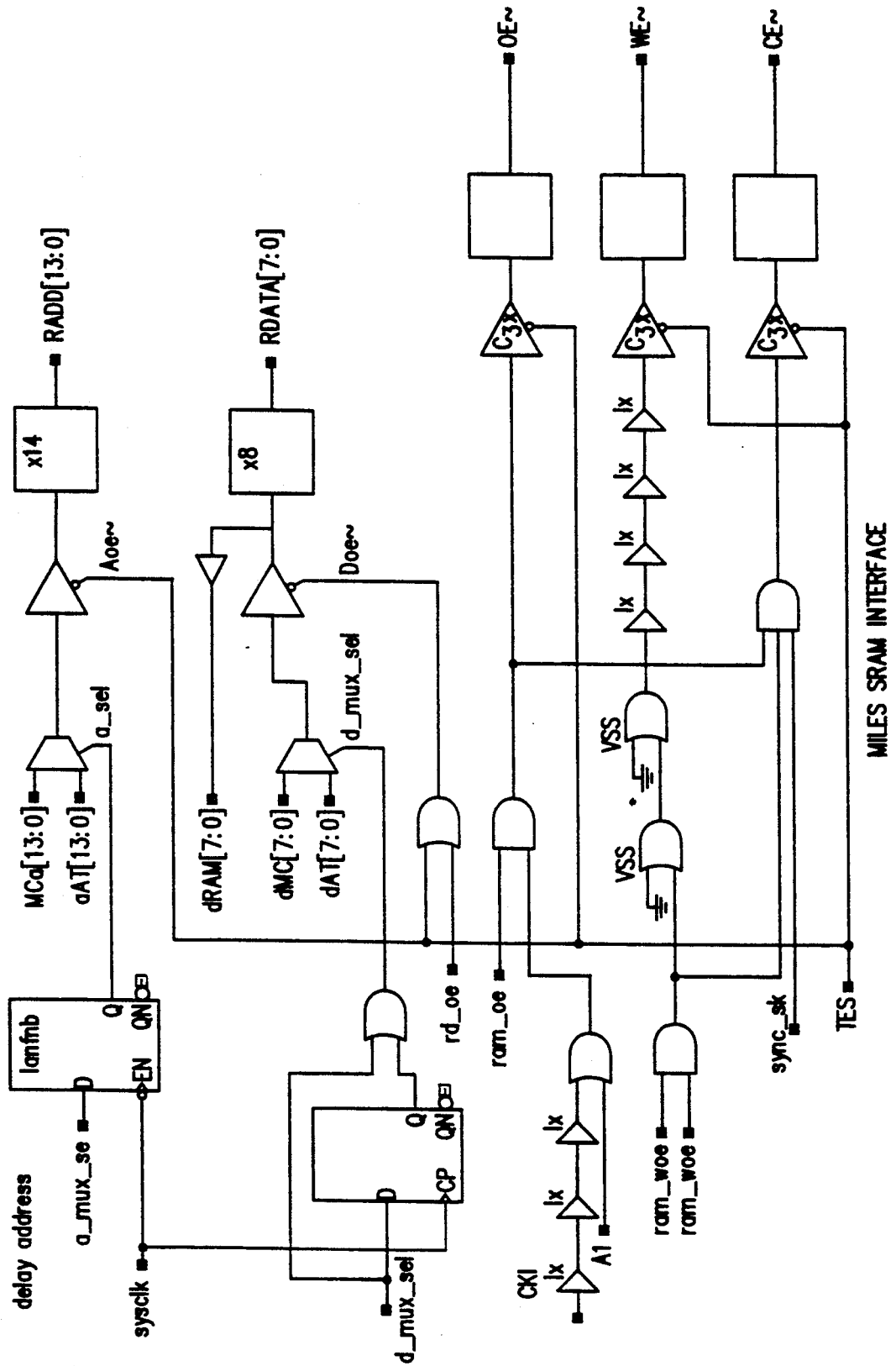
Figure 6D:
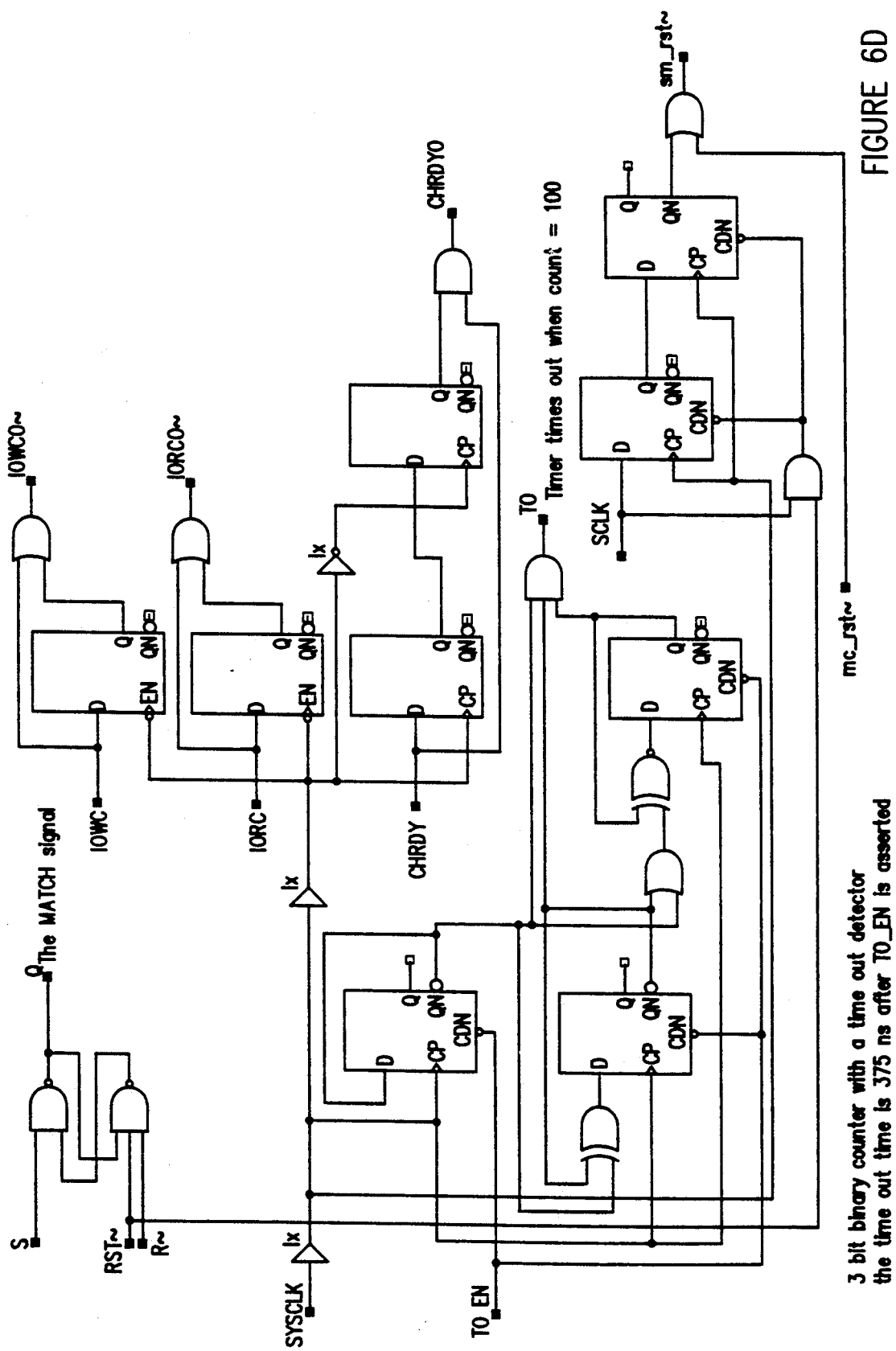

FIG. 6D is a diagram of the misc_blk block shown in FIG. 6e. Note that this includes a 3 bit binary counter which will time out about 375 ns after TO_EN is asserted.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The presently preferred embodiments, as discussed above, use Intel microprocessor for the CPU. However, of course, the disclosed innovations can also be applied to systems using other non-Intel microprocessors of comparable architecture. The disclosed innovations can also be applied to other systems using other types of CPU, such as 680×0, SPARC, MIPS, or others. It is contemplated that, in the future, the disclosed innovations can also be applied to systems using a multiprocessor CPU.

The presently preferred embodiment relates to systems used in the ISA architecture. However, it is alternatively possible to adapt at least some of the disclosed teachings to other bus architectures, including not only the EISA bus architecture (which is an extension of ISA), but also the many other buses which are now in use or which may find use in the future.

The presently preferred embodiment uses Headland Technology and VTI chips for CPU support functions. However, of course, a wide variety of other chips are available to perform these functions, and many substitutions are possible. In particular, some microprocessors have been proposed with added support functions on-chip. For another example, compact modules incorporating a microprocessor with peripheral support functions are also available. A huge variety of such substitutions can be made, while still obtaining the benefits of the disclosed inventions.

Of course, many I/O and storage peripherals can be added into a laptop system. The disclosed innovations are generally applicable to such systems, regardless of what peripherals have or have not been added. Thus, for example, a laptop which contains a large bank of NVSRAM, or which is connected to an Ethernet adapter, or which includes speech recognition or synthesis, would still present many power-management issues similar to those discussed above.

For example, the principal disclosed embodiment, as presently practiced, does not include any available expansion slots for the user to add cards into. However, it is contemplated that addition of an expansion bus might be advantageous, and particularly so in combination with the microcontroller power-management architecture described above.

For another example, the principal disclosed embodiment, as presently practiced, never stops the system clock. In the 286 embodiment, the clock is slowed to 250 kHz, and in the SX embodiment the clock is slowed to 2 MHz. A fully static chip set, which would permit the system clock to be stopped would be even more advantageous; but, in the presently preferred embodiment, the HT21 chip and the SX chip are not compatible with fully static operation. Nevertheless, this is an obviously desirable modification, as the appropriate chipsets become available.

For another example, the principal disclosed embodiment, as presently practiced, uses Ni-Cd rechargeable batteries, and a small lithium cell as a nonrechargeable backup battery; but at least some of the disclosed innovative teachings can be practiced with other rechargeable battery technologies (such as NiH cells), if such technologies become commercially practicable, and/or can be practiced with nonrechargeable batteries in place of the NiCds of the preferred embodiment, and/or can be practiced with nonrechargeable batteries other than lithium cells.

In particular, it should be noted that—although the presently preferred embodiment uses rechargeable batteries—the present invention is not by any means limited to rechargeable batteries. In any battery-powered computer system, it will be desirable to exploit sleep and standby modes to maximize operating life while minimizing the intrusions on the user's work habits. Thus, accommodation of changing user needs must be reconciled with optimal power management. The disclosed innovations advantageously provide a broad new approach to this problem. The disclosed inventions provide systems which not only have better functional specifications, but which are less annoying to users. Although this factor is hard to quantify, it is a very important advantage.

It should also be noted that other algorithms, besides those disclosed herein, can be used for adaptively detecting the changing needs of users. Such modifications can readily be incorporated into the disclosed embodiments, while still retaining at least some of the advantages thereof.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A portable electronic system, comprising:
   at least one microprocessor;
   at least one battery power connection, and a ground terminal;
   a voltage-sensing interface, connected so that said microprocessor can detect the voltage drop across said battery connection; and
   a current-sensing interface, connected so that said microprocessor can detect the current flow through said battery connection;
   said microprocessor being configured to repeatedly compare the voltage and current at said battery connection, at an instant when the current through said connection is small, with the voltage and current at said battery connection at another substantially contemporaneous instant when the current through said connection is larger; and to indicate imminent battery failure when the source impedance seen at said battery connection is accordingly detected to have risen in a pattern corresponding to the internal impedance of a battery which is imminently failing.

2. The system of claim 1, wherein said microprocessor is a microcontroller.

3. The system of claim 1, wherein said microprocessor is a microcontroller, and includes on-chip analog interface circuits.

4. The system of claim 1, wherein said system is a portable computer.

5. The system of claim 1, wherein said system is a portable computer, and said microprocessor is separate from the CPU thereof.

6. A portable electronic system, comprising:
   at least one microprocessor;
   first and second battery power connections;
   a voltage-sensing interface, connected so that said microprocessor can detect the voltage drop across said first battery connection, and also, independently thereof, can detect the voltage drop across said second battery connection; and
   a current-sensing interface, connected so that said microprocessor can detect the current flow through said first battery connection, and also, independently thereof, can detect the current flow through said second battery connection;
   said microprocessor being configured to repeatedly compare the voltage and current at said first battery connection, at an instant when the current through said first battery connection is small, with the voltage and current at said first battery connection at another substantially contemporaneous instant when the current through said first battery connection is larger, and
   to repeatedly compare the voltage and current at said second battery connection, at an instant when the current through said second battery connection is small, with the voltage and current at said second battery connection at another substantially contemporaneous instant when the current through said second battery connection is larger; and
   to indicate imminent battery failure when the source impedance seen at said battery connection is accordingly detected to have risen in a pattern corresponding to the internal impedance of a battery which is imminently failing.

7. The system of claim 6, wherein said microprocessor is a microcontroller, and includes on-chip analog interface circuits.

8. The system of claim 6, wherein said system is a portable computer.

9. The system of claim 6, wherein first battery connection includes a ground terminal, and said second battery connection also includes a ground terminal which is common with the ground terminal of said first battery connection.

10. The system of claim 6, wherein said system is a portable computer, and said microprocessor is separate from the CPU thereof.

11. A method for automatic battery management, in a portable electronic system, comprising the operations of:
   repeatedly measuring the voltage and current of a battery bank, under changing load conditions;
   making a calculation, in a microprocessor, which is substantially equivalent to estimating the internal impedance of the battery bank; and
   indicating imminent battery failure when the internal impedance of the battery bank is accordingly estimated to have risen in a pattern corresponding to a battery which is approaching failure.

12. The method of claim 11, wherein said microprocessor is a microcontroller.

13. The method of claim 11, wherein said microprocessor is a microcontroller, and includes on-chip analog interface circuits.

14. The method of claim 11, wherein said system is a portable computer, and said microprocessor is separate from the CPU thereof.

15. A method for automatic battery management, in a portable electronic system, comprising the operations of:

repeatedly measuring the battery voltage and load current of a battery bank, under changing load conditions;

making a calculation, in a microprocessor, of how the battery voltage responds when the load current changes; and indicating imminent battery failure when an observed change in load current causes a change in battery voltage which is sufficiently large, in relation to the observed change in load current, to approximate the voltage-change-to-current-change ratio of a battery which is approaching failure.

16. The method of claim 15, wherein said microprocessor is a microcontroller, and includes on-chip analog interface circuits.

17. The method of claim 15, wherein said system is a portable computer, and said microprocessor is separate from the CPU thereof.

* * * * *